US008861561B2

(12) United States Patent
Kawakami et al.

(10) Patent No.: US 8,861,561 B2
(45) Date of Patent: Oct. 14, 2014

(54) SEMICONDUCTOR LASER CHIP, SEMICONDUCTOR LASER DEVICE, AND SEMICONDUCTOR LASER CHIP MANUFACTURING METHOD

(75) Inventors: Toshiyuki Kawakami, Osaka (JP); Akira Ariyoshi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 563 days.

(21) Appl. No.: 12/926,660

(22) Filed: Dec. 2, 2010

(65) Prior Publication Data
US 2011/0134948 A1   Jun. 9, 2011

(30) Foreign Application Priority Data
Dec. 4, 2009 (JP) ................................. 2009-276555

(51) Int. Cl.
| | |
|---|---|
| H01S 5/22 | (2006.01) |
| B82Y 20/00 | (2011.01) |
| H01S 5/343 | (2006.01) |
| H01S 5/042 | (2006.01) |
| H01S 5/022 | (2006.01) |
| H01S 5/024 | (2006.01) |
| H01S 5/02 | (2006.01) |
| H01S 5/16 | (2006.01) |

(52) U.S. Cl.
CPC ........... *H01S 5/34333* (2013.01); *H01S 5/2214* (2013.01); *H01S 5/02276* (2013.01); *H01S 5/02212* (2013.01); *H01S 5/02476* (2013.01); *H01S 5/0202* (2013.01); *H01S 5/0207* (2013.01); *B82Y 20/00* (2013.01); *H01S 5/16* (2013.01); *H01S 5/02461* (2013.01); *H01S 5/02272* (2013.01); *H01S 5/0425* (2013.01)
USPC ........................ 372/46.01; 372/34; 372/43.01

(58) Field of Classification Search
USPC ............................................ 372/43.01, 46.01
See application file for complete search history.

(56) References Cited

U.S. PATENT DOCUMENTS

| | | | | |
|---|---|---|---|---|
| 4,779,280 | A * | 10/1988 | Sermage et al. | 372/45.01 |
| 6,735,230 | B1 * | 5/2004 | Tanabe et al. | 372/43.01 |
| 7,012,012 | B2 * | 3/2006 | Yeom et al. | 438/462 |
| 2004/0013149 | A1 * | 1/2004 | Hanaoka | 372/46 |
| 2004/0165626 | A1 | 8/2004 | Kuniyasu et al. | 372/34 |
| 2005/0069006 | A1 * | 3/2005 | Tatsumi | 372/50 |
| 2009/0207872 | A1 * | 8/2009 | Takei et al. | 372/44.01 |

FOREIGN PATENT DOCUMENTS

| | | | |
|---|---|---|---|
| JP | 59151484 | 8/1984 | ............. H01L 23/36 |
| JP | 10070335 | 3/1998 | |
| JP | 11168075 | 6/1999 | |

(Continued)

OTHER PUBLICATIONS

JP 11186662, Sep. 7, 1999.

*Primary Examiner* — Xinning Niu
(74) *Attorney, Agent, or Firm* — Harness, Dickey & Pierce, P.L.C.

(57) ABSTRACT

Provided is a semiconductor laser chip improved more in heat dissipation performance. This semiconductor laser chip includes a substrate, which has a front surface and a rear surface, nitride semiconductor layers, which are formed on the front surface of the substrate, an optical waveguide (ridge portion), which is formed in the nitride semiconductor layers, an n-side electrode, which is formed on the rear surface of the substrate, and notched portions, which are formed in regions that include the substrate to run along the optical waveguide (ridge portion). The notched portions have notched surfaces on which a metal layer connected to the n-side electrode is formed.

15 Claims, 21 Drawing Sheets

(56) References Cited

FOREIGN PATENT DOCUMENTS

| | | | | |
|---|---|---|---|---|
| JP | 2000-244008 | 9/2000 | ............. | H01L 33/14 |
| JP | 2002-158393 | 5/2002 | ............. | H01S 5/024 |
| JP | 3618989 | 11/2004 | | |
| JP | 2007-042857 | 2/2007 | ............. | H01L 33/00 |
| JP | 2007-096112 | 4/2007 | ............. | H01L 33/32 |
| JP | 2007-129143 | 5/2007 | ............ | H01L 21/301 |
| JP | 2007-184316 | 7/2007 | ................ | H01S 5/22 |
| JP | 2007-311682 | 11/2007 | ............. | H01S 5/026 |
| JP | 2009-224382 | 10/2009 | ............. | H01L 33/00 |

\* cited by examiner

SEMICONDUCTOR LASER CHIP, SEMICONDUCTOR LASER DEVICE, AND SEMICONDUCTOR LASER CHIP MANUFACTURING METHOD

This application is based on Japanese Patent Application No. 2009-276555 filed on Dec. 4, 2009, the contents of which are hereby incorporated by reference.

BACKGROUND OF THE INVENTION

1. Field of the Invention

The present invention relates to a semiconductor laser chip, a semiconductor laser device, and a semiconductor laser chip manufacturing method.

2. Description of Related Art

Nitride semiconductors which are compounds of a group III element such as Al, Ga, or In and a group V element N are promising semiconductor materials for light emitting elements, power elements, and the like because of their band structure and chemical stability. Various applications of nitride semiconductors have therefore been tried, and one of those applications is a nitride semiconductor laser element, which is used as the light source of an optical information recording device such as an optical disk drive. Nitride semiconductor laser elements have achieved reliability and cost reduction in recent years, owing to the use of GaN substrates, an advance in crystal growth technology, well-designed element structures, improved wafer processing technology, and other factors, and have created a market as commercial products.

The expectation on nitride semiconductors as a fluorescent material excitation light source is also high because of their short oscillation wavelength. A typical application to a fluorescent material excitation light source is a white LED using a nitride semiconductor. In recent years, high power lasers made from nitride semiconductors, too, are attracting attention for uses in the next-generation directional lights, television sets, and the like where directionality and high power are required. In these uses, semiconductor lasers generate a large amount of heat and how to dissipate heat is important.

A known way to improve heat dissipation performance is to connect a plurality of wires to a p-side electrode (positive electrode) of a nitride semiconductor laser element. An example of this method is described in JP 3618989 B.

FIG. 40 is a perspective view of a conventional nitride semiconductor laser device described in JP 3618989 B. As illustrated in FIG. 40, the nitride semiconductor laser device described in JP 3618989 B includes a semiconductor laser element 1000, an electrode terminal 1100, and a plurality of wires 1200. The semiconductor laser element 1000 has a substrate 1010 on which a laminated structure 1020 is formed from a nitride semiconductor necessary for laser oscillation. In the laminated structure 1020, a stripe-like (strip-like) oscillation region (optical waveguide) 1030 is formed. A p-side ohmic metal contact 1040 is formed on a top surface of the laminated structure 1020. The plurality of wires 1200 are connected to a top surface of the p-side ohmic metal contact 1040 in a manner that distributes the wires 1200 along the length of the oscillation region 1030. In the thus structured nitride semiconductor laser device of JP 3618989 B, heat generated in the oscillation region 1030 is dissipated via the plurality of wires 1200 connected to the p-side ohmic metal contact 1040.

Semiconductor lasers for uses in the next-generation lights, television sets, and the like, or industrial lasers for processing uses, generate a large amount of heat, which means that their laser elements deteriorate fast. It is therefore a common practice to make laser elements for these uses a "broad area type," where the ridge stripe (ridge width) is set wide.

The inventors of the subject application conducted a reliability test on a broad area nitride semiconductor laser element having a ridge width of 7 μm and employing the heat dissipation measure of JP 3618989 B. It was found as a result that the element life span was not improved significantly by the conventional heat dissipation method described above alone.

While the light source of an optical information recording device is generally required to have a life span of about several thousand hours to ten thousand hours, the requested life span of an excitation light source is far longer at several ten thousand hours to hundred thousand hours. The optical power necessary for use as an excitation light source is very high at one watt to several watts, and the amount of heat generated by a laser element for use as an excitation light source is accordingly several times larger than the amount of heat generated by a laser element for use as the light source of an optical information recording device. Considering these facts, reasons for the poor result of the reliability test are presumably because slowing down the deterioration of a light emitting layer by setting the ridge width wide and thus lowering the optical density does not produce a sufficient effect, and because only a limited amount of heat dissipates via the wires.

In short, the conventional heat dissipation method described in JP 3618989 B is not satisfactorily effective in enhancing heat dissipation performance and still leaves room for improvement in heat dissipation performance.

The conventional method which connects a plurality of wires to the p-side electrode thus has a problem of difficulties in improving heat dissipation performance satisfactorily. The insufficient heat dissipation performance causes another problem by degrading the element characteristics and lowering reliability. The problems are serious particularly when a laser element is used as an excitation light source and a large amount of heat is generated.

SUMMARY OF THE INVENTION

The present invention has been made to solve the above-mentioned problems, and an object of the present invention is therefore to provide a semiconductor laser chip which can be more improved in heat dissipation performance, a semiconductor laser device to which the semiconductor laser chip is mounted, and a method of manufacturing the semiconductor laser chip.

Another object of the present invention is to provide a highly reliable semiconductor laser chip that has excellent characteristics, a semiconductor laser device that includes the semiconductor laser chip, and a method of manufacturing the semiconductor laser chip.

In order to achieve the above-mentioned objects, a semiconductor laser chip according to a first aspect of the present invention includes: a substrate that includes one principal surface and another principal surface opposite from the one principal surface; semiconductor layers formed on the one principal surface of the substrate; an optical waveguide formed in the semiconductor layers; a first metal layer formed on the another principal surface of the substrate; and first notched portions formed in regions that include the substrate and running along the optical waveguide. The first notched portions include notched surfaces covered, at least partially, with a second metal layer, which is in contact with the first metal layer.

As described above, in the semiconductor laser chip according to the first aspect, the first notched portions running along the optical waveguide are formed in the regions that include the substrate, and the second metal layer in contact with the first metal layer is formed on at least portions of the notched surfaces of the first notched portions. The semiconductor laser chip when mounted junction up is therefore embedded up to the second metal layer in a heat dissipating material such as solder. This cuts short the distance from the optical waveguide (active layer) to the heat dissipating material, and hence heat generated in the optical waveguide (active layer) is dissipated effectively. The temperature of the optical waveguide (active layer) is thus lowered, to thereby slow down the deterioration of the optical waveguide (active layer). As a result, the element life span is prolonged and high reliability is obtained.

In the first aspect where the second metal layer is formed on the notched surfaces of the first notched portions, the semiconductor laser chip fixed onto, for example, a submount is increased in the area of thermal contact with the submount. This also improves heat dissipation performance.

The first aspect structured as above improves heat dissipation performance more and consequently prevents the degradation of characteristics due to insufficient heat dissipation performance. In addition, because of the prolonged element life span, more chips have a life span that is within the range of standards in the first aspect. The yield, too, is therefore improved.

In the semiconductor laser chip according to the first aspect, it is preferred that the semiconductor laser chip further include side faces, which stretch along the optical waveguide, and that the first notched portions be formed in the side faces. The semiconductor laser chip structured as this is easily embedded up to the second metal layer in a heat dissipating material such as solder. Heat generated in the optical waveguide (active layer) is thus dissipated easily.

In this case, it is preferred that the substrate and the semiconductor layers include a pair of the side faces which are opposed from each other, and that one first notched portion be formed in each of the pair of the side faces. With this structure, heat generated in the optical waveguide is dissipated even more effectively.

In the semiconductor laser chip according to the first aspect, it is preferred that the semiconductor layer include a nitride semiconductor layer. With this structure, a highly reliable nitride semiconductor laser chip having excellent characteristics is easily obtained. In addition, mounting the thus structured nitride semiconductor laser chip junction up lowers the operating voltage while slowing down the deterioration of the optical waveguide (active layer).

In the semiconductor laser chip according to the first aspect, it is preferred that the notched surfaces of the first notched portions be constituted of slopes slanted with respect to a normal line direction of the substrate.

In the semiconductor laser chip according to the first aspect, it is more preferred that the notched surfaces of the first notched portions be constituted of slopes slanted at an angle of 7° or less with respect to the normal line direction of the substrate.

In the semiconductor laser chip according to the first aspect, it is preferred that the first notched portions have a depth in a thickness direction of the substrate from the another principal surface of the substrate which is 10% or more and less than 50% of a combined thickness of the substrate and the semiconductor layers. With this structure, the yield is prevented from dropping while heat dissipation performance is improved more In the semiconductor laser chip according to the first aspect, the semiconductor laser chip may further include mirror facets orthogonal to the optical waveguide, and that the mirror facets have second notched portions formed on the substrate side. In this case, it is preferred that the first metal layer be formed on the second notched portion as well by stretching the first metal layer.

In the semiconductor laser chip according to the first aspect, it is preferred that the semiconductor laser chip further include side faces, which stretch along the optical waveguide, and that the optical waveguide be placed off a center of the semiconductor layers and closer to one of the side faces. This structure cuts short the distance from the optical waveguide to the first notched portions, and heat generated in the optical waveguide is dissipated even more effectively.

In the semiconductor laser chip according to the first aspect, it is preferred that the first metal layer and the second metal layer be formed from the same metal material. With this structure, the first metal layer and the second metal layer can be formed by the same. process, and man-hour for the manufacture of the semiconductor laser chip is reduced, which means less manufacture cost.

In the semiconductor laser chip according to the first aspect, the first metal layer and the second metal layer may be formed from different metal materials.

A semiconductor laser device according to a second aspect of the present invention includes the semiconductor laser chip according to the first aspect, and the semiconductor laser chip is embedded in a heat dissipating material up to the notched surfaces of the first notched portions.

As described above, in the semiconductor laser device according to the second aspect, the semiconductor laser chip is embedded in the heat dissipating material up to the notched surfaces of the first notched portions, to thereby shorten the distance from the optical waveguide (active layer) to the heat dissipating material. Heat generated in the optical waveguide (active layer) is thus dissipated effectively. This lowers the temperature of the optical waveguide (active layer) and accordingly slows down the deterioration of the optical waveguide (active layer). As a result, the life span of the semiconductor laser chip is prolonged and the semiconductor laser device obtains a high reliability.

In the semiconductor laser device according to the second aspect, it is preferred that the semiconductor laser device further include a (heat dissipation base on which the semiconductor laser chip is mounted, and that the semiconductor laser chip be fixed junction up on the heat dissipation base via the heat dissipating material. With this structure, the deterioration of the optical waveguide (active layer) is easily slowed down and the life span of the semiconductor laser chip is easily prolonged.

In this case, it is preferred that the heat dissipation base include a step portion which has a bottom surface and a side wall, and that at least the second metal layer formed on one of the notched surfaces be brought into thermal contact with the side wall via the heat dissipating material by fixing the semiconductor laser chip onto the bottom surface of the step portion. This structure improves the heat dissipation efficiency even more and a semiconductor laser device having an even higher reliability is obtained.

In the structure including the heat dissipation base, it is preferred that the heat dissipation base be a submount.

In the semiconductor laser device according to the second aspect, it is preferred that the heat dissipating material be solder.

A method of manufacturing a semiconductor laser chip according to a third aspect of the present invention includes:

growing nitride semiconductor layers on a front surface of a substrate; forming a current channel portion in the nitride semiconductor layers; forming groove portions in a rear surface of the substrate so as to run parallel to the current channel portion; forming a metal layer on the rear surface of the substrate including at least portions of side faces of the groove portions; and parting the substrate along the groove portions. Further, the forming groove portions includes forming the grooves by laser scribing.

As described above, the method of manufacturing a semiconductor laser chip according to the third embodiment includes forming the groove portions by laser scribing. The depth of the groove portions can therefore be adjusted freely and set satisfactorily deep. This facilitates the parting of the substrate along the groove portions and prevents the yield in breaking the wafer into chips from dropping.

In the third aspect, the metal layer is formed on the rear surface of the substrate including at least portions of the side faces of the groove portions, to thereby form the metal layer on the side faces of the groove portions as well. A semiconductor laser chip more improved in heat dissipation performance is thus manufactured easily.

In the third aspect structured as above, a highly reliable semiconductor laser chip having excellent characteristics is easily manufactured.

In the method of manufacturing a semiconductor laser chip according to the third aspect, it is preferred that the forming a metal layer include forming the metal layer by sputtering. With this structure, the metal layer is formed more efficiently on the side faces of the groove portions as well which are not positioned right across from a target.

The method of manufacturing a semiconductor laser chip according to the third aspect may further include, after the forming a metal layer, forming a plating layer on the metal layer. When the metal layer is formed on the rear surface of the substrate including at least portions of the side faces of the groove portions, the formed metal layer may be very thin on the side faces of the groove portions in some cases. This could lower the wettability of a heat dissipating material such as solder when embedding the semiconductor laser chip in the heat dissipating material. In the third aspect structured as above, the plating layer is formed to a uniform thickness on the side faces of the groove portions as well, and the wettability of solder is prevented from dropping.

In the method of manufacturing a semiconductor laser chip according to the third aspect, it is preferred to form the groove portions such that the side faces of the groove portions form slopes slanted at an angle of 7° or less with respect to the normal line direction of the substrate. This structure facilitates the parting of the substrate along the groove portions even more, and the yield in breaking the wafer into chips is easily prevented from dropping.

In the method of manufacturing a semiconductor laser chip according to the third aspect, it is preferred to set the depth of the groove portions to 10% or more and less than 50% of the combined thickness of the substrate and the semiconductor layers. With this structure, a semiconductor laser chip high in heat dissipation performance is manufactured with an even higher yield.

As described above, according to the present invention, a semiconductor laser chip more improved in heat dissipation performance is easily obtained, as well as a semiconductor laser device to which the semiconductor laser chip is mounted and a method of manufacturing the semiconductor laser chip.

In addition, according to the present invention, a highly reliable semiconductor laser chip having excellent characteristics is easily obtained, as well as a semiconductor laser device to which the semiconductor laser chip is mounted and a method of manufacturing the semiconductor laser chip.

DETAILED DESCRIPTION OF PREFERRED EMBODIMENTS

Before concrete embodiments of the present invention are described, findings made by the inventors of the subject application through various studies are discussed.

The inventors of the subject application first attempted to mount a nitride semiconductor laser chip junction down (a fixing method in which a ridge portion of an element is located on the side of a heat dissipation base such as a submount) on a submount. Junction down mounting is efficient in dissipating heat from an optical waveguide, compared to junction up mounting (a fixing method in which an element substrate is located on the side of a heat dissipation base such as a submount).

However, this study revealed a new problem which arose by mounting a nitride semiconductor laser chip junction down. The problem is that the operating voltage rises because the temperature of an ohmic metal contact (a p-side electrode) with respect to a p-type nitride semiconductor layer is lower when the laser chip is mounted junction down than when the laser chip is mounted junction up.

The p-side electrode of the nitride semiconductor laser chip is very high in contact resistance and therefore has great influence over the operating voltage of the element. In addition, the p-type nitride semiconductor layer itself has a high series resistance. On the other hand, a nitride semiconductor is low in contact resistance and series resistance when the temperature is high. A high temperature is therefore preferred for the p-type nitride semiconductor layer from the standpoint of lowering the operating voltage.

When the nitride semiconductor laser chip is mounted junction down, the p-side electrode is closer to the submount (heat dissipation base) than the active layer, and the temperature of the p-type nitride semiconductor layer is lowered accordingly more efficiently. The inventors of the subject application found that this aggravated the problem of mounting the laser chip junction down.

When the nitride semiconductor laser chip is mounted junction up, on the other hand, the p-side electrode itself generates heat due to contact resistance, and the p-side electrode is farther from the submount (heat dissipation base) than the active layer, which is the main source of heat generation. Therefore, in the laser chip mounted junction up, the p-side electrode and the p-type nitride semiconductor layer reach a high temperature more readily than in the laser chip mounted junction down, and the operating voltage tends to be low.

The inventors of the subject application thus found through the studies described above that mounting a semiconductor laser chip junction up has an effect in that the resistance of a p-type semiconductor layer side electrode is easily lowered.

Embodiments that embody the present invention are described below in detail with reference to the drawings.

First Embodiment

Figure 1:
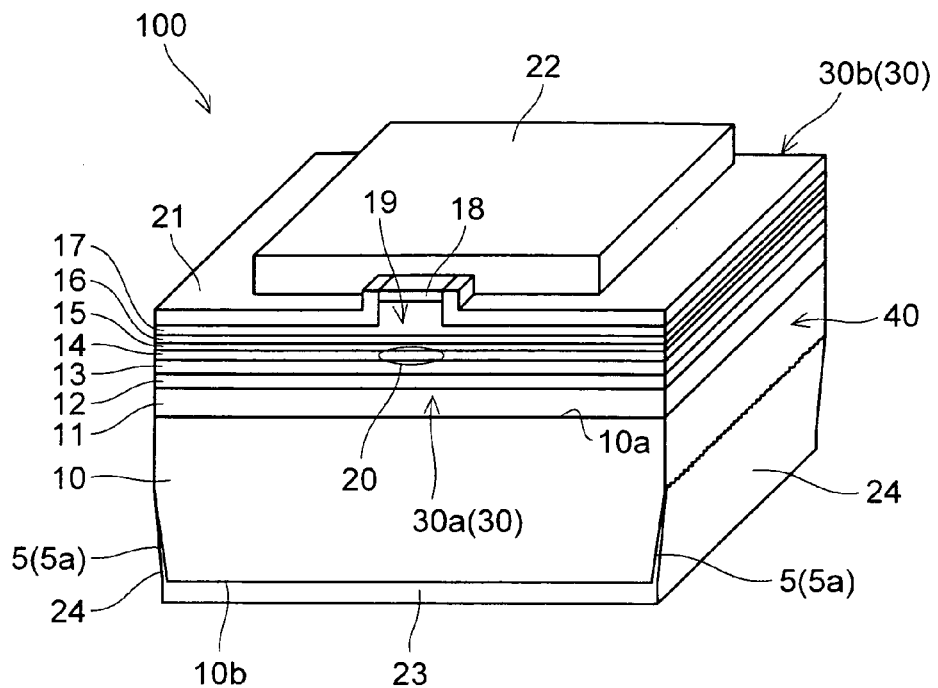
FIG. 1 is a perspective view of a semiconductor laser chip according to a first embodiment of the present invention.
Figure 2:
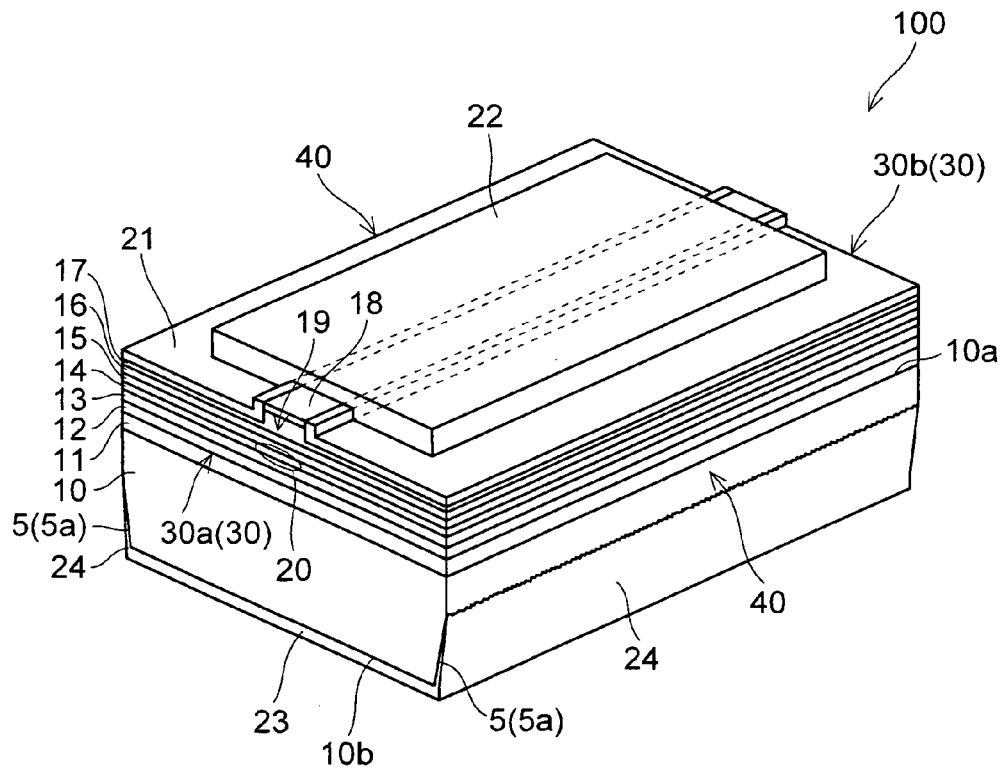
FIG. 2 is a perspective view of the semiconductor laser chip according to the first embodiment of the present invention.
Figure 3:
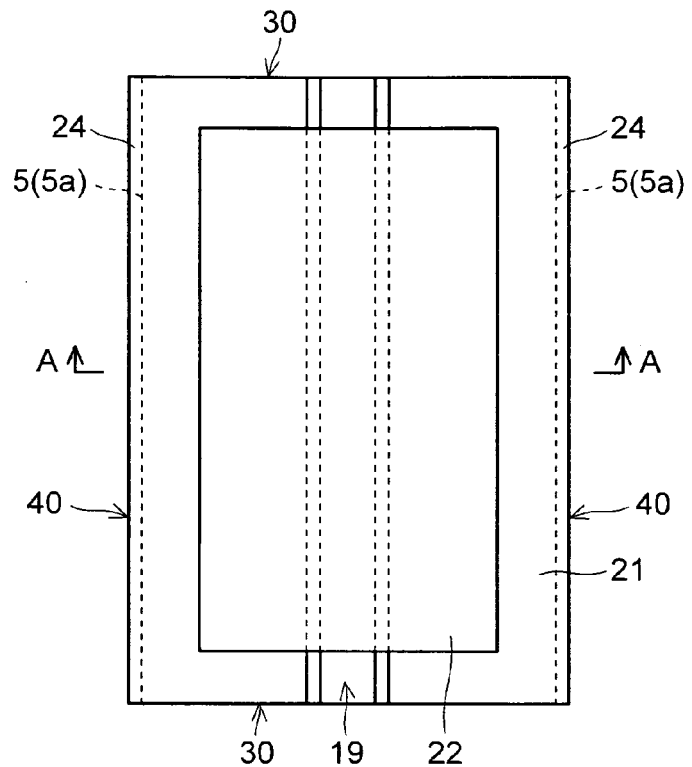
FIG. 3 is a plan view of the semiconductor laser chip according to the first embodiment of the present invention viewed from above.
Figure 4:
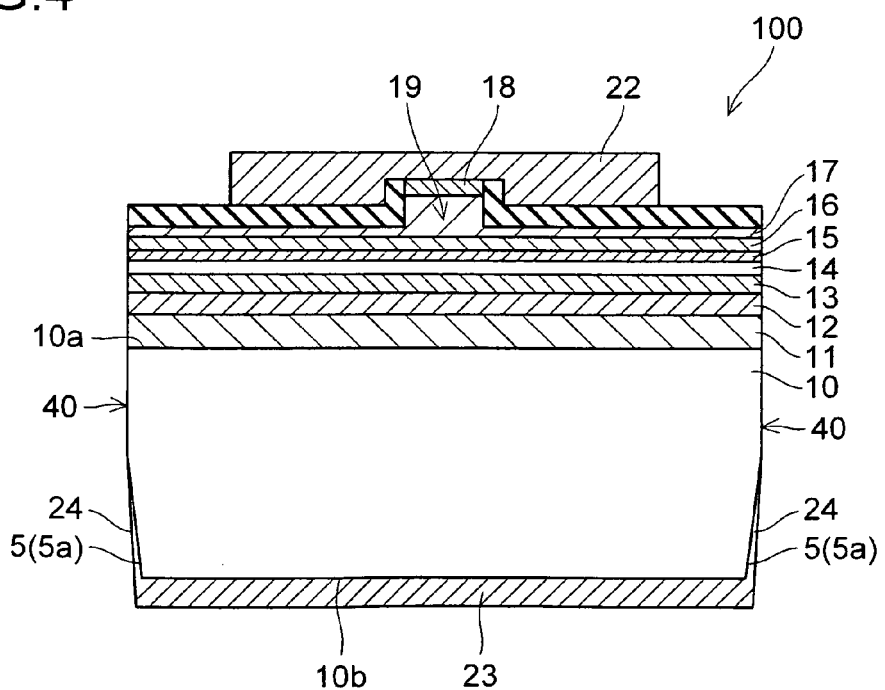
FIG. 4 is a sectional view of the semiconductor laser chip according to the first embodiment of the present invention.
Figure 5:
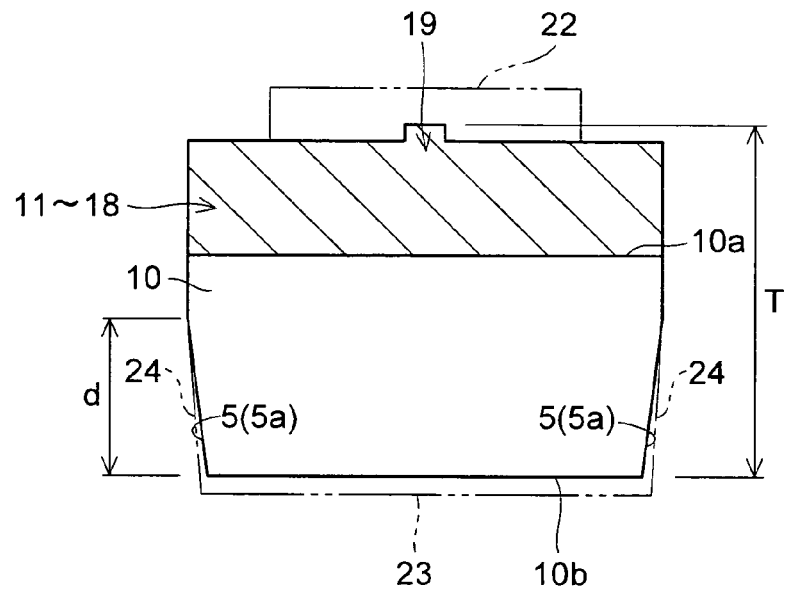
FIG. 5 is a sectional view schematically illustrating the semiconductor laser chip according to the first embodiment of the present invention.
Figure 6:
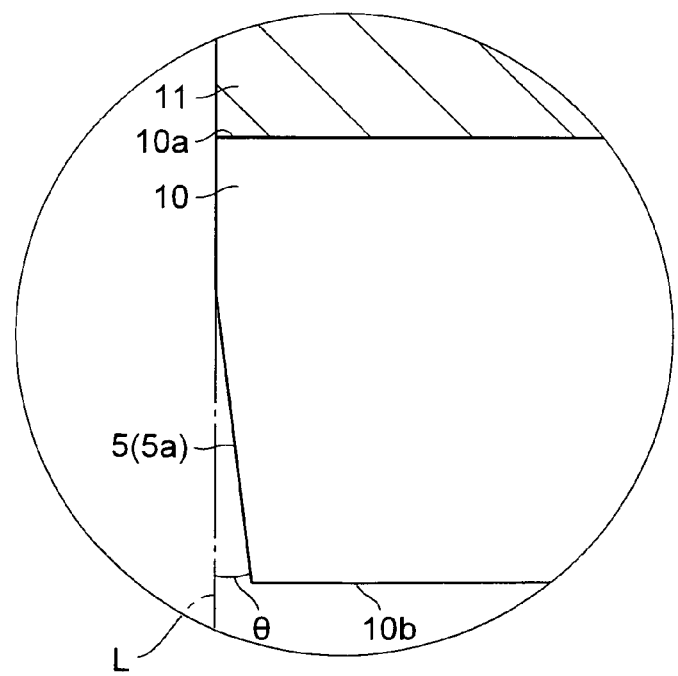
FIG. 6 is an enlarged sectional view of a part of the semiconductor laser chip according to the first embodiment of the present invention.

FIGS. 1 and 2 are perspective views of a semiconductor laser chip according to a first embodiment of the present invention. FIG. 3 is a plan view of the semiconductor laser chip according to the first embodiment of the present invention viewed from above. FIG. 4 is a sectional view of the semiconductor laser chip according to the first embodiment of the present invention. FIGS. 5 and 6 are views illustrating the structure of the semiconductor laser chip according to the first embodiment of the present invention. The sectional view of FIG. 4 is taken along the line A-A of FIG. 3. Described first with reference to FIGS. 1 to 6 is the structure of the semiconductor laser chip according to the first embodiment of the present invention which is denoted by 100.

The semiconductor laser chip 100 according to the first embodiment includes, as illustrated in FIGS. 1, 2, and 4, a substrate 10, which has a front surface (one principal surface) 10a and a rear surface (the other principal surface) 10b. A plurality of nitride semiconductor layers are laminated on the front surface 10a of the substrate 10. A stripe-like (strip-like)

ridge portion 19, which is described later, is formed in a part of the nitride semiconductor layers laminated on the front surface 10a of the substrate 10.

As illustrated in FIG. 2, the semiconductor laser chip 100 according to the first embodiment also has a pair of mirror facets 30 orthogonal to the ridge portion 19. The pair of mirror facets 30 are constituted of a light emitting .surface 30a from which laser light exits and a light reflecting surface 30b which is opposite to the light emitting surface 30a. As illustrated in FIGS. 3 and 4, a pair of side faces 40 are formed along the ridge portion 19 such that one side surface 40 is on each side of the ridge portion 19. Notched portions 5 running parallel to the ridge portion 19 are formed in regions of the side faces 40 that include the substrate 10 (regions on the side of the substrate 10) as illustrated in FIGS. 2 to 4. The notched portions 5 have notched surfaces 5a on which a metal layer 24 connected to an n-side electrode (negative electrode) 23 is formed. The notched portions 5 are an example of "first notched portions" of the present invention. The n-side electrode 23 is an example of a "first metal layer" of the present invention. The metal layer 24 is an example of a "second metal layer" of the present invention.

To give a concrete example of the structure of the semiconductor laser chip 100 according to the first embodiment, the substrate 10 is an n-type GaN substrate having a thickness of approximately 100 μm. A lower contact layer 11 is formed on the front surface 10a of the substrate 10 from n-type GaN to a thickness of approximately 0.1 μm to approximately 10 μm (e.g., approximately 4 μm). A lower cladding layer 12 is formed on the lower contact layer 11 from n-type $Al_{0.05}Ga_{0.95}N$ to a thickness of approximately 0.5 μm to approximately 3.0 μm (e.g., approximately 2 μm). A lower guide layer 13 is formed on the lower cladding layer 12 from n-type GaN to a thickness of 0 μm to approximately 0.2 μm (e.g., approximately 0.1 μm). An active layer 14 is formed on the lower guide layer 13.

The active layer 14 has a multiple-quantum well (MQW) structure in which quantum well layers made of $In_{x1}Ga_{1-x1}N$ and barrier layers made of $In_{x2}Ga_{1-x2}N$ (x1>x2) are alternately laminated. The quantum well layers are each formed from $In_{x1}Ga_{1-x1}N$ (x1=0.05 to 0.1) to a thickness of, for example, approximately 4 nm. The barrier layers are each formed from $In_{x2}Ga_{1-x2}N$ (x2=0 to 0.05) to a thickness of, for example, approximately 8 nm.

A evaporation preventing layer 15 is formed on the active layer 14 from p-type $Al_{0.3}Ga_{0.7}N$ to a thickness of 0 μm to approximately 0.02 μm (e.g., approximately 0.01 μm). An upper guide layer 16 is formed on the evaporation preventing layer 15 from p-type GaN to a thickness of 0 μm to approximately 0.2 μm (e.g., approximately 0.01 μm). An upper cladding layer 17 is formed on the upper guide layer 16 from p-type $Al_{0.05}Ga_{0.95}N$ to have a convex portion and a flat portion, which is the entire upper cladding layer 17 excluding the convex portion.

An upper contact layer 18 is formed on the convex portion of the upper cladding layer 17 from p-type GaN to a thickness of approximately 0.01 μm to approximately 1.0 μm (e.g., approximately 0.05 μm). The upper contact layer 18 and the convex portion of the upper cladding layer 17 constitute the stripe-like (strip-like) ridge portion 19. The ridge portion 19 is an example of a "current channel portion" of the present invention.

The ridge portion 19 is formed to run in a direction orthogonal to the mirror facets 30 as illustrated in FIGS. 1 to 3. A stripe-like (strip-like) part of the active layer 14 which is located below the ridge portion 19 serves as an optical waveguide 20.

An embedding layer 21 is formed on each side of the ridge portion 19 as illustrated in FIGS. 2 and 4. The embedding layer 21 is made of an insulating material such as $SiO_2$, SiN, $Al_2O_3$, or $ZrO_2$. With this structure, light can be confined in a horizontal transverse mode and in a vertical transverse mode. The embedding layer 21, when less than 500 Å in thickness, has a possibility that a waveguide loss is caused by the absorption of light. Therefore, unless the intention is to exploit this nature (light absorption) of the embedding layer 21 actively, a preferred thickness of the embedding layer 21 is 500 Å or more.

A p-side electrode 22 is formed on top faces of the embedding layer 21 and the upper contact layer 18 in order to inject carriers from a top surface of the ridge portion 19. The p-side electrode 22 is formed so as to cover a part of the upper contact layer 18, and forms an ohmic contact with the upper contact layer 18, which is made of p-type GaN. A main feature of nitride semiconductors is that their p-type semiconductors are high in resistivity and less likely to generate p-type carriers. It is therefore difficult for the p-side electrode 22 to form an ohmic contact. Accordingly, a preferred electrode metal that forms the p-side electrode 22 is a metal material having a large work function such as Ni, Pd, Pt, or Au. The p-side electrode 22 may be a laminate (multilayer structure) of layers of these metals to supply a current to the ridge portion 19 via a wire or the like. To give a concrete example of the multilayer structure of the p-side electrode 22, a Pd layer and an Au layer may be laminated in order from the side of the embedding layer 21, or a Ni layer and an Au layer may be laminated in order from the side of the embedding layer 21. The p-side electrode 22 may also have a multilayer structure sandwiching a Ti layer or a W layer, which improves the adhesion between layers.

On the rear surface 10b of the substrate 10, the n-side electrode 23 is formed as illustrated in FIGS. 1, 2, and 4 in order to inject carriers from under the substrate 10. The n-side electrode 23 forms an ohmic contact with the substrate 10, which is made of n-type GaN. A preferred electrode metal, that forms the n-side electrode 23 is a metal material having a small work function such as Hf, Ti, Al, or W. To give a concrete example of the structure of the n-side electrode 23, the n-side electrode 23 may have a multilayer structure in which a Hf layer, an Al layer, a Mo layer, a Pt layer, and an Au layer are laminated in order from the side of the substrate 10, or a multilayer structure in which a Ti layer, a Pt layer, and an Au layer are laminated in order from the side of the substrate 10.

In the first embodiment, the notched portions 5 running parallel to the ridge portion 19 are formed in the side faces 40 of the semiconductor laser chip 100 on the side of the substrate 10 as illustrated in FIGS. 1 to 4. One notched portion 5 is formed in each of the pair of side faces 40 such that the notched portion 5 spans the entire length of the side surface 40 (ridge portion 19).

The notched portions 5 in the first embodiment have a given depth d in the thickness direction of the substrate 10 from the rear surface 10b of the substrate 10. It is preferred that the depth d of the notched portions 5 be 10% or more and less than 50% of an element thickness T (see FIG. 5). The element thickness T is, as illustrated in FIG. 5, a thickness from the rear surface 10b of the substrate 10 to the top surface of the ridge portion 19, and is equal to the combined thicknesses of the substrate 10 and the nitride semiconductor layers 11 to 18.

In the first embodiment, as illustrated in FIG. 6, the notched surfaces 5a of the notched portions 5 are slopes slanted at a given angle θ with respect to a normal line direction (the direction of a normal line L) of the substrate 10. It is preferred that the angle θ at which the slopes of the notched surfaces 5a of the notched portions 5 are slanted with respect to the normal line direction of the substrate 10 be 7° or less.

The notched surfaces 5a of the notched portions 5 extend along the side faces 40 of the semiconductor laser chip 100, thereby making the notched portions 5 a part of the side faces 40 of the semiconductor laser chip 100.

In the first embodiment, the metal layer 24 connected to the n-side electrode 23 is formed on the notched surfaces 5a of the notched portions 5. The metal layer 24 is formed from the same metal material as that of the n-side electrode 23, and the metal layer 24 and the n-side electrode 23 are formed integrally. Specifically, the metal layer 24 is formed on the notched surfaces 5a of the notched portions 5 by stretching the n-side electrode 23 to the notched surfaces 5a of the notched portions 5. The n-side electrode 23 and the metal layer 24 are thus connected to each other without interruptions at the corners of the rear surface 10b of the substrate 10.

The metal layer 24 is preferably formed over the entire notched surfaces 5a, but the notched surfaces 5a may have regions where the metal layer 24 is not formed. In short, it is sufficient if the metal layer 24 is formed on at least a part of each notch surface 5a.

An Au layer which has high wettability with respect to solder is preferred as the topmost surface of the n-side electrode 23 and the metal layer 24, in order to improve the wettability of solder used to fix the semiconductor laser chip 100 to a submount.

The light emitting surface 30a of the semiconductor laser chip 100 includes an exit (emission) side coating film (not shown) which has a reflectance of, for example, 5% to 80%. The light reflecting surface 30b includes a reflective side coating film (not shown) which has a reflectance of, for example, 95%. The exit (emission) side coating film is, for example, a multilayer film in which an aluminum oxynitride or aluminum nitride ($AlO_xN_{1-x}$ ($0 \leq x \leq 1$)) film having a thickness of 30 nm and an aluminum oxide ($Al_2O_3$) film having a thickness of 215 nm are laminated in order from the exit (emission) end surface of the semiconductor laser chip 100. The reflective side coating film is, for example, a multilayer film of $SiO_2$ and $TiO_2$. Other than those materials, dielectric films of $SiN$, $ZrO_2$, $Ta_2O_5$, $MgF_2$, and the like may be used.

As described above, in the semiconductor laser chip 100 according to the first embodiment, the notched portions 5 running along the ridge portion 19 (optical waveguide 20) are formed in regions of the side faces 40 that include the substrate 10 (regions on the side of the substrate 10), and the metal layer 24 connected to the n-side electrode 23 is formed on at least a part of each notch surface 5a of the notched portions 5, to thereby wet the side faces 40 (notched portions 5) with a heat dissipating material such as solder when the semiconductor laser chip 100 is mounted junction up. This way, the semiconductor laser chip 100 can be embedded up to the metal layer 24 in the heat dissipating material, thereby reducing the distance from the optical waveguide 20 (active layer 14) to the heat dissipating material. Heat generated in the optical waveguide 20 (active layer 14) is thus dissipated effectively and the temperature of the optical waveguide 20 (active layer 14) is lowered. The deterioration of the optical waveguide 20 (active layer 14) is accordingly slowed down, with the result that the element obtains a prolonged life span and a high reliability.

The semiconductor laser chip 100 according to the first embodiment thus slows down the deterioration of the active layer 14 by lowering the overall temperature while making use of the advantages of junction up mounting in which the resistance of the p-type semiconductor side electrode (p-side electrode 22) is easily lowered.

The first embodiment structured as above improves heat dissipation performance more and consequently prevents the degradation of characteristics due to insufficient heat dissipation performance.

The first embodiment, in which one notched portion 5 with the overlying metal layer 24 is formed in each of the pair of side faces 40, is also capable of dissipating heat that is generated in the optical waveguide 20 more effectively.

With the depth d of the notched portions 5 set to 10% or more and less than 50% of the element thickness T, heat dissipation performance is improved more and, in addition, the yield is prevented from dropping.

Figure 7:
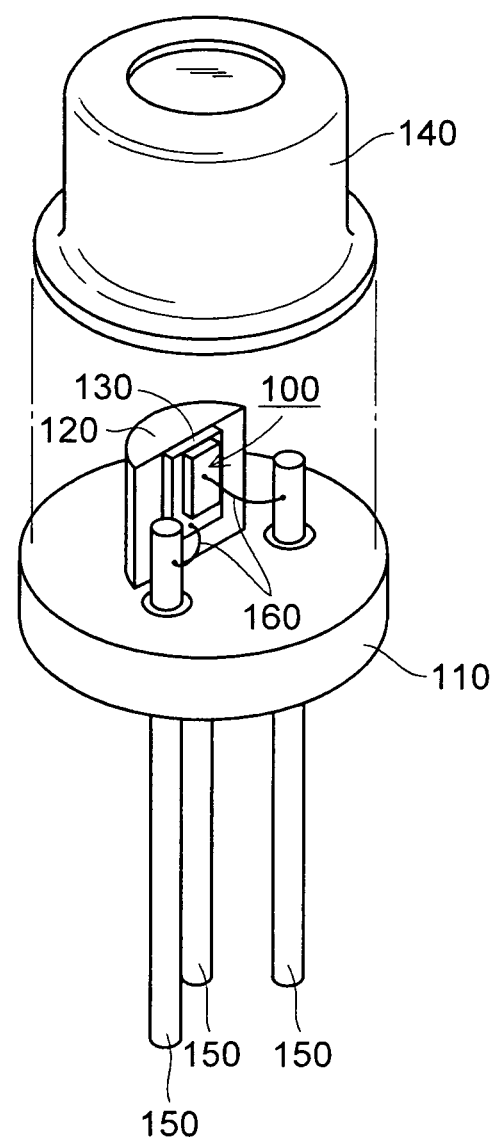
FIG. 7 is a perspective view of a semiconductor laser device according to the first embodiment of the present invention.
Figure 8:
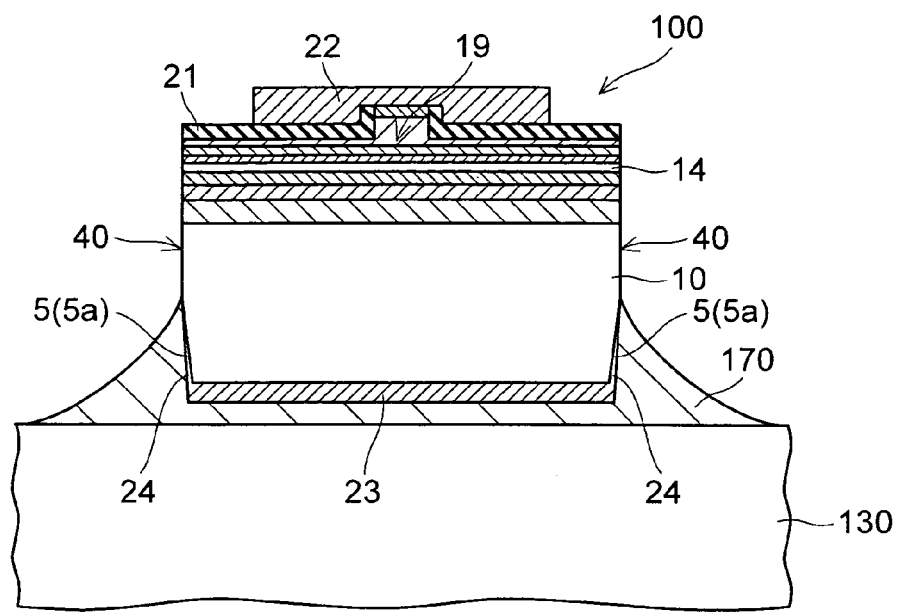
FIG. 8 is a sectional view illustrating an example of how the semiconductor laser chip is mounted to the semiconductor laser device according to the first embodiment of the present invention.
Figure 9:
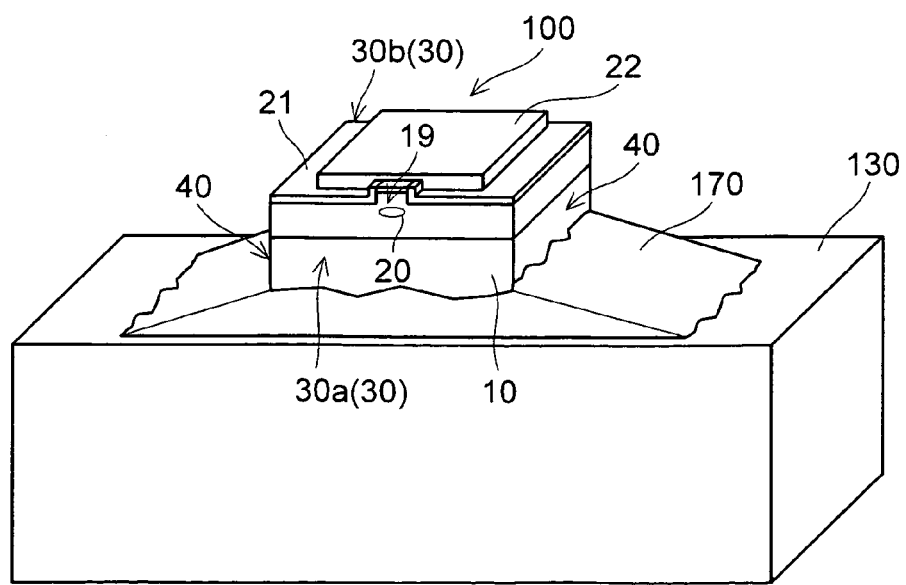
FIG. 9 is a perspective view illustrating the example of FIG. 8 which is about how the semiconductor laser chip is mounted to the semiconductor laser device according to the first embodiment of the present invention.

FIG. 7 is a perspective view of a semiconductor laser device according to the first embodiment of the present invention. FIGS. 8 and 9 are views illustrating an example of how the semiconductor laser chip is mounted to the semiconductor laser device according to the first embodiment of the present invention. In FIGS. 8 and 9, the semiconductor laser chip according to the first embodiment is mounted junction up. The following is a description of the semiconductor laser device according to the first embodiment which is given with reference to FIG. 5 and FIGS. 7 to 9.

The semiconductor laser device according to the first embodiment is can-packaged as illustrated in FIG. 7, and the semiconductor laser chip 100 of the first embodiment described above is mounted to the semiconductor laser device.

The semiconductor laser device according to the first embodiment further includes a stem 110, a block portion 120, which is placed on a top surface of the stem 110 to function as a heat sink, a submount 130, which is attached to a side surface of the block portion 120, a cap 140, which is fixed to the top surface of the stem 110, and lead pins 150. The submount 130 is an example of a "heat dissipation base" of the present invention.

In the semiconductor laser device according to the first embodiment, the semiconductor laser chip 100 is fixed junction up to a top surface of the submount 130. The semiconductor laser chip 100 fixed to the submount 130 is electrically connected to the lead pins 150 via wires 160.

As illustrated in FIGS. 8 and 9, the first embodiment uses solder 170 to fix the semiconductor laser chip 100 to the submount 130, thereby embedding the semiconductor laser chip 100 in the solder 170 up to the notched portions 5 formed in the side faces 40. The solder 170 is an example of a "heat dissipating material" of the present invention. The submount 130 is formed from, for example, a material having excellent heat conductivity such as AlN, SiC, or diamond.

In the semiconductor laser device according to the first embodiment, where the semiconductor laser chip 100 is embedded up to the side faces 40 in the solder 170, a distance from the optical waveguide 20 (active layer 14) to the solder 170 is short, and heat generated in the optical waveguide 20 (active layer 14) is therefore dissipated effectively. This lowers the temperature of the optical waveguide 20 (active layer 14) and accordingly slows down the deterioration of the optical waveguide 20 (active layer 14). As a result, the element life span is prolonged and high reliability is obtained.

The first embodiment structured as described above is large in area where the semiconductor laser chip 100 is in thermal contact with the submount 130 via the solder 170. When the chip width of the semiconductor laser chip 100 is 200 μm and the depth d (see FIG. 5) of the notched portions 5 is 50 μm, for example, the area of the thermal contact is 1.5 times larger than when the notched portions 5 are not provided. This effect is more profound when the chip width is smaller. For example, in the case where the chip width is 120 µm and the notched portions 5 as deep as 50 µm, the area of the thermal contact is approximately 1.83 times larger. Heat from the optical waveguide 20 of the semiconductor laser chip 100 is dissipated more easily when the area of the thermal contact with the submount 130 is larger. The large thermal contact area is another feature of the first embodiment that improves heat dissipation performance. This structure therefore slows down the deterioration of the optical waveguide 20 (active layer 14) easily and the element life span is prolonged easily.

Moreover, in the first embodiment, the semiconductor laser chip 100 is mounted junction up, thereby placing the p-side electrode 22 at a point farthest from the submount 130 and the solder 170, and hence the temperature of the p-side electrode 22 is prevented from dropping and an unnecessary voltage rise is avoided. The operating voltage can therefore be set low. This arrangement also places the, active layer 14, which is a source of heat generation, and its surrounding components closer to the submount 130 than the p-side electrode 22, and thus ensures the life span improving effect.

Figure 10:
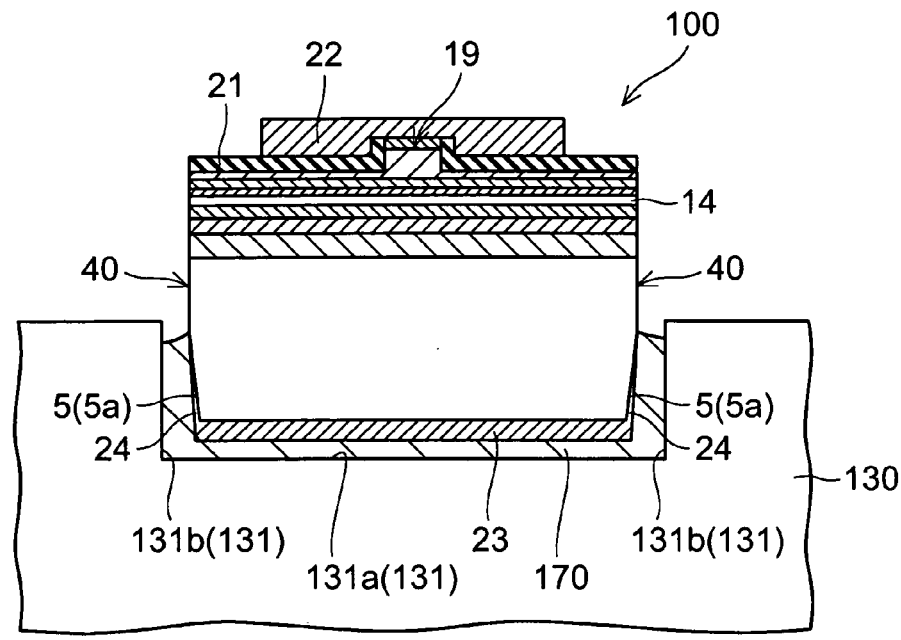
FIG. 10 is a sectional view illustrating another example of how the semiconductor laser chip is mounted to the semiconductor laser device according to the first embodiment of the present invention.
Figure 11:
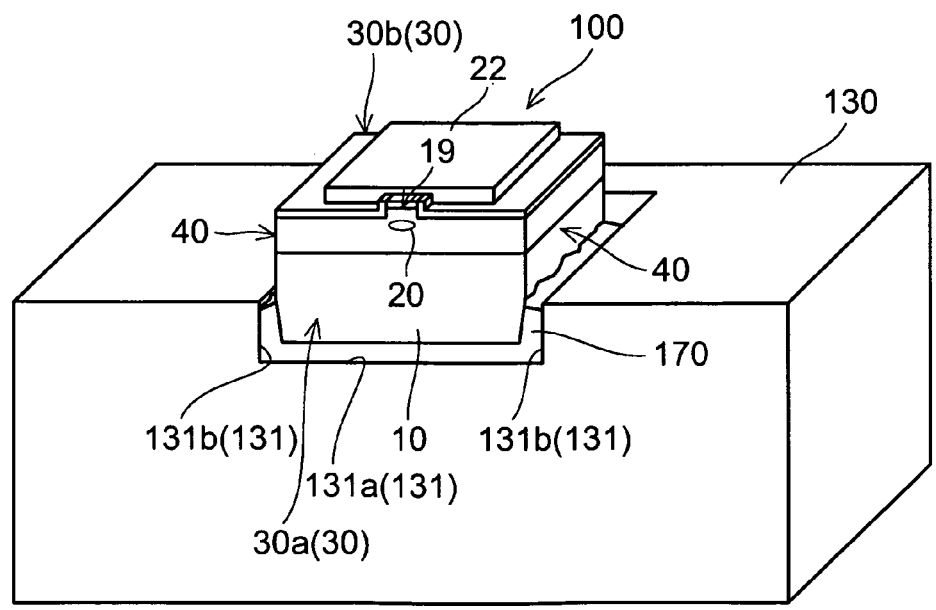
FIG. 11 is a perspective view illustrating the other example of how the semiconductor laser chip is mounted to the semiconductor laser device according to the first embodiment of the present invention.
Figure 12:
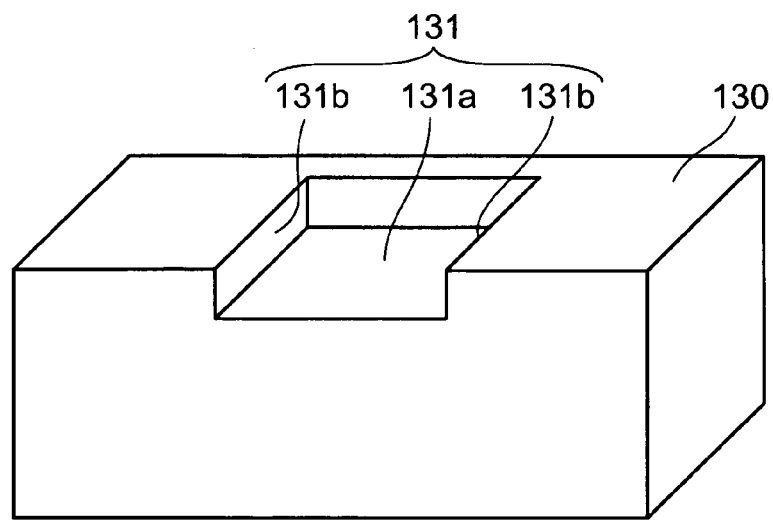
FIG. 12 is a view illustrating the other example of how the semiconductor laser chip is mounted to the semiconductor laser device according to the first embodiment of the present invention (a perspective view of a submount).

FIGS. 10 to 12 are views illustrating another example of how the semiconductor laser chip is mounted to the semiconductor laser device according to the first embodiment of the present invention. The other example of how the semiconductor laser chip 100 is mounted is described next with reference to FIGS. 10 to 12.

In the other chip mount example of the first embodiment, a trench 131 suited to the width (in plan view) of the semiconductor laser chip 100 is formed in the top surface of the submount 130 as illustrated in FIGS. 10 and 12. The trench 131 has a bottom surface 131a and side walls 13 1b. The semiconductor laser chip 100 is fixed onto the bottom surface 131a of the trench 131 via the solder 170. The trench 131 is an example of a. "step portion" of the present invention.

In the other chip mount example of the first embodiment, the semiconductor laser chip 100 is arranged such that its side faces 40 (notched portions 5) surface the side walls 131b of the trench 131, and the solder 170 fills gaps between the side faces 40 (notched portions 5) and the side walls 131b of the trench 131. The metal layer 24 on the notched portions 5 is therefore in thermal contact with the submount 130 (side walls 131b) via the solder 170.

The heat conductivity of the solder 170 is several times smaller than that of a nitride semiconductor. It is therefore preferred to interpose only a small amount of solder 170 between the side faces 40 of the semiconductor laser chip 100 and the submount 130 by setting small gaps between the side faces 40 of the semiconductor laser chip 100 and the side walls 131 b of the trench 131. With this structure, the semiconductor laser chip 100 is embedded in the submount 130 (solder 170) such that the semiconductor laser chip 100 is placed closer to the submount 130 (in a manner that places the side faces 40 (notched portions 5) of the semiconductor laser chip 100 and the side walls 131b of the trench 131 across a shorter distance from each other).

As described above, in the other chip mount example of the first embodiment, the trench 131 having the bottom surface 131a and the side walls 131b is formed in the top surface of the submount 130, and the semiconductor laser chip 100 is mounted on the bottom surface 131 a of the trench 131. This brings the n-side electrode 23 into thermal contact with the bottom surface 131 a of the trench 131 via the solder 170 and brings the metal layer 24, which is formed on the notched portions 5, into thermal contact with the side walls 131b of the trench 131 via the solder 170, thereby placing the optical waveguide 20 (active layer 14) closer to the submount 130.

Therefore, heat, generated in the optical waveguide 20 (active layer 14) is transmitted more efficiently to the submount 130 via the metal layer 24 formed on the notched portions 5, and dissipated accordingly effectively. The temperature of the optical waveguide 20 (active layer 14) is thus lowered easily, making it easy to slow down the deterioration of the optical waveguide 20 (active layer 14). As a result, the element life span is easily prolonged.

FIGS. 13 to 23 are views illustrating a semiconductor laser chip manufacturing method according to the first embodiment of the present invention. A method of manufacturing the semiconductor laser chip 100 according to the first embodiment is described next with reference to FIGS. 4, 5, and 8 and FIGS. 13 to 23.

Figure 13:
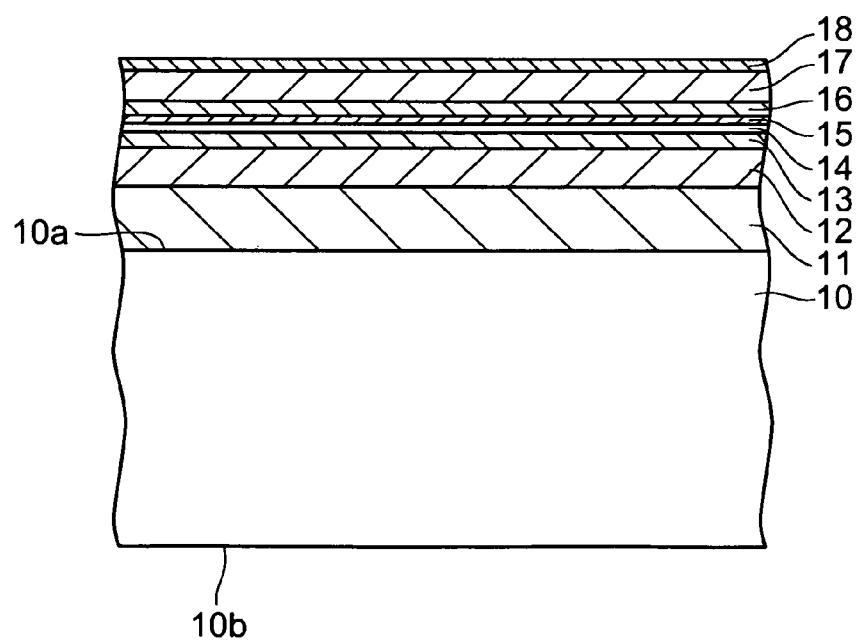
FIG. 13 is a sectional view illustrating a semiconductor laser chip manufacturing method according to the first embodiment of the present invention.

First, as illustrated in FIG. 13, metal organic chemical vapor deposition (MOCVD) is used to grow the nitride semiconductor layers 11 to 18 on the substrate 10 made of n-type GaN. Specifically, the lower contact layer 11 made of n-type GaN and having a thickness of approximately 0.1 µm to approximately 10 µm (e.g., approximately 4 µm), the lower cladding layer 12 made of n-type $Al_{0.05}Ga_{0.95}N$ and having a thickness of approximately 0.5 µm to approximately 3.0 µm (e.g., approximately 2 µm), the lower guide layer 13 made of n-type GaN and having a thickness of 0 µm to approximately 0.2 µm (e.g., approximately 0.1 µm), and the active layer 14 are grown in order on the front surface 10a of the substrate 10. The active layer 14 is grown by, for example, alternately growing four barrier layers each of which has a thickness of approximately 8 nm and is made of $In_{x2}Ga_{1-x2}N$ (x2=0 to 0.05) and three quantum well layers each of which has a thickness of approximately 4 nm and is made of $In_{x1}Ga_{1-x1}N$ (x1=0.05 to 0.1). The active layer 14 having an MQW structure that is constituted of quantum well layers and barrier layers is formed on the lower guide layer 13 in this manner.

Subsequently, on the active layer 14, the evaporation preventing layer 15 made of p-type $Al_{0.3}Ga_{0.7}N$ and having a thickness of 0 µm to approximately 0.02 µm (e.g., approximately 0.01 µm), the upper guide layer 16 made of p-type GaN and having a thickness of 0 µm to approximately 0.2 µm (e.g., approximately 0.1 µm), the upper cladding layer 17 made of p-type $Al_{0.05}Ga_{0.95}N$ and having a thickness of approximately 0.1 µm to approximately 1.0 µm (e.g., approximately 0.5 µm), and the upper contact layer 18 made of p-type GaN and having a thickness of approximately 0.01 µm to approximately 1.0 µm (e.g., approximately 0.05 µm) are grown in order.

Figure 14:
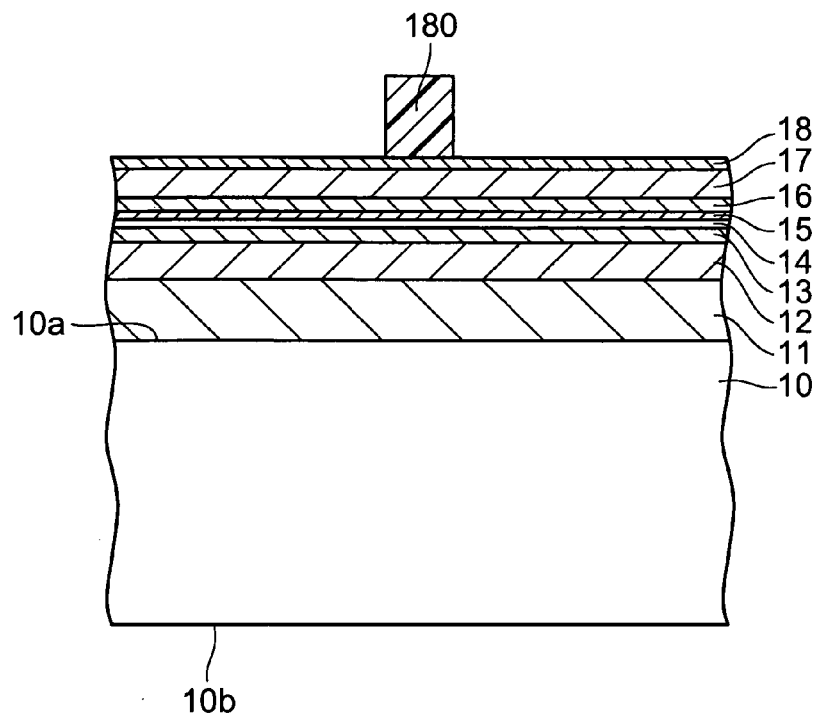
FIG. 14 is a sectional view illustrating the semiconductor laser chip manufacturing method according to the first embodiment of the present invention.
Figure 15:
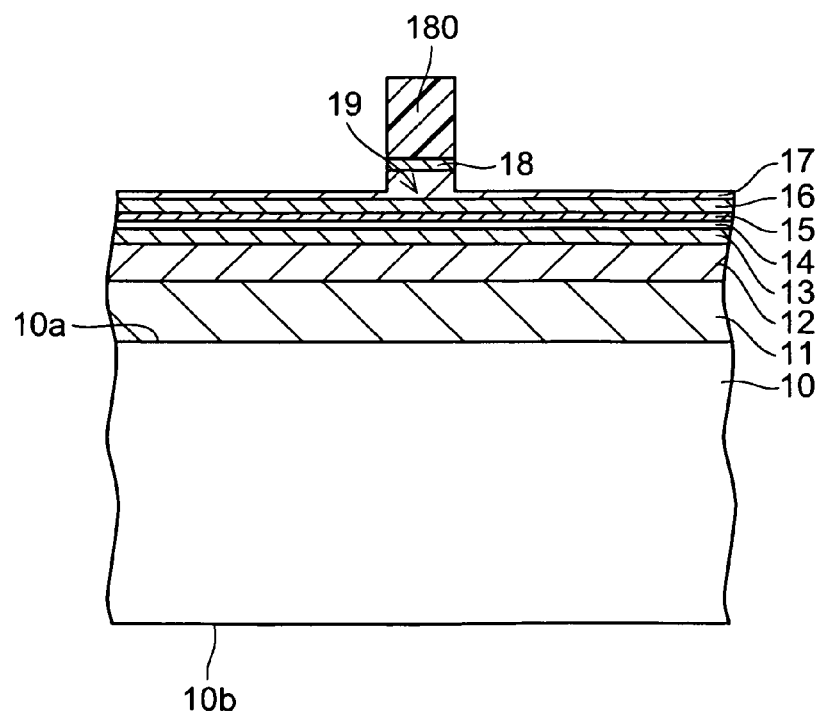
FIG. 15 is a sectional view illustrating the semiconductor laser chip manufacturing method according to the first embodiment of the present invention.

Next, as illustrated in FIG. 14, photolithography or the like is used to form resists 180 on the upper contact layer 18 in a stripe pattern so that the resists 180 run parallel to one another in a given direction. As illustrated in FIG. 15, the resists 180 are used as masks to etch the layers down to a point in the upper cladding layer 17 by reactive ion etching (RIE) with a chlorine-based gas such as $SiCl_4$ or $Cl_2$, or with an Ar gas. A plurality of ridge portions 19 are thus formed in a stripe pattern to run parallel to one another in a given direction. Each ridge portion 19 is constituted of the convex portion of the upper cladding layer 17 and the upper contact layer 18.

Figure 16:
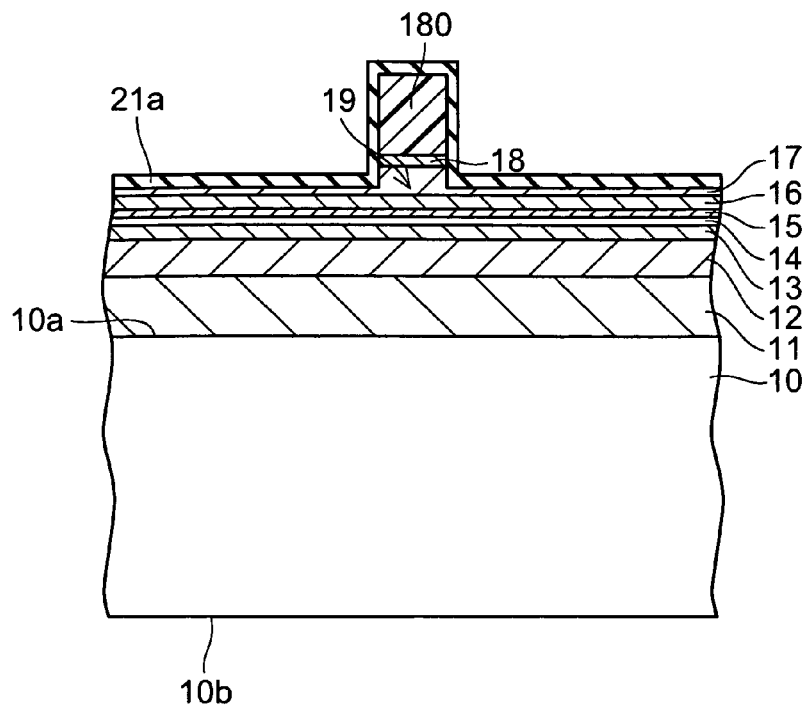
FIG. 16 is a sectional view illustrating the semiconductor laser chip manufacturing method according to the first embodiment of the present invention.
Figure 17:
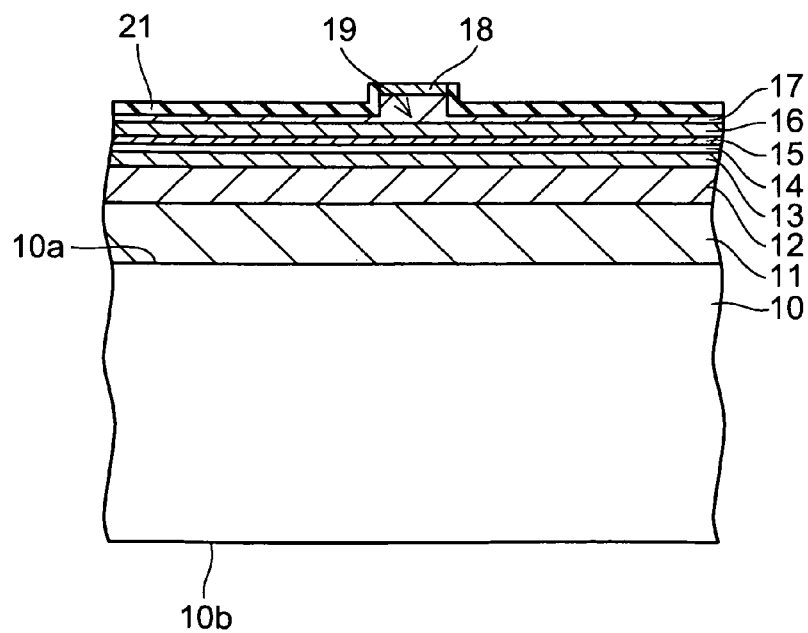
FIG. 17 is a sectional view illustrating the semiconductor laser chip manufacturing method according to the first embodiment of the present invention.

As illustrated in FIG. 16, the resists 180 are left on the ridge portions 19 while sputtering or the like is performed to form an $SiO_2$ layer 21a having a thickness of approximately 0.1 µm to approximately 0.3 µm (e.g., approximately 0.15 µm) in which the ridge portion 19 is embedded. The resists 180 are then removed by lift-off to expose the top of each ridge portion 19 (the top surface of the upper contact layer 18). The embedding layer 21 illustrated in FIG. 17 is thus formed on each side of each ridge portion 19.

Figure 18:
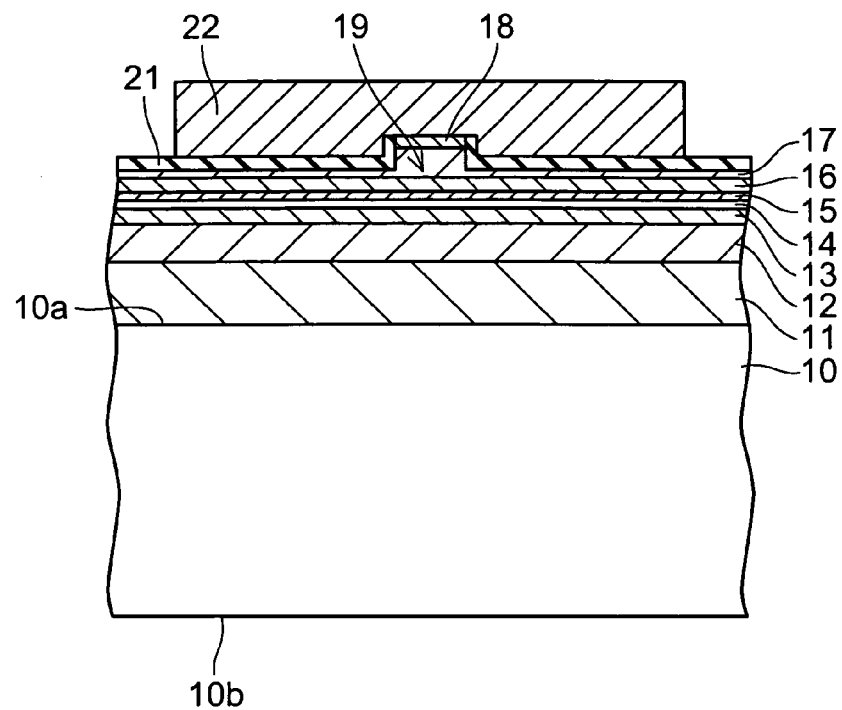
FIG. 18 is a sectional view illustrating the semiconductor laser chip manufacturing method according to the first embodiment of the present invention.

Formed next by a combination of photolithography and evaporation, or by other methods, is the p-side electrode 22 which is patterned as illustrated in FIG. 18. Thereafter, the rear surface 1013 of the substrate 10 (semiconductor wafer) is thinned by grinding or polishing down to a thickness of approximately 80 μm to approximately 150 μm (e.g., approximately 100 μm) in order to facilitate the parting of the substrate 10 (semiconductor wafer).

Figure 19:
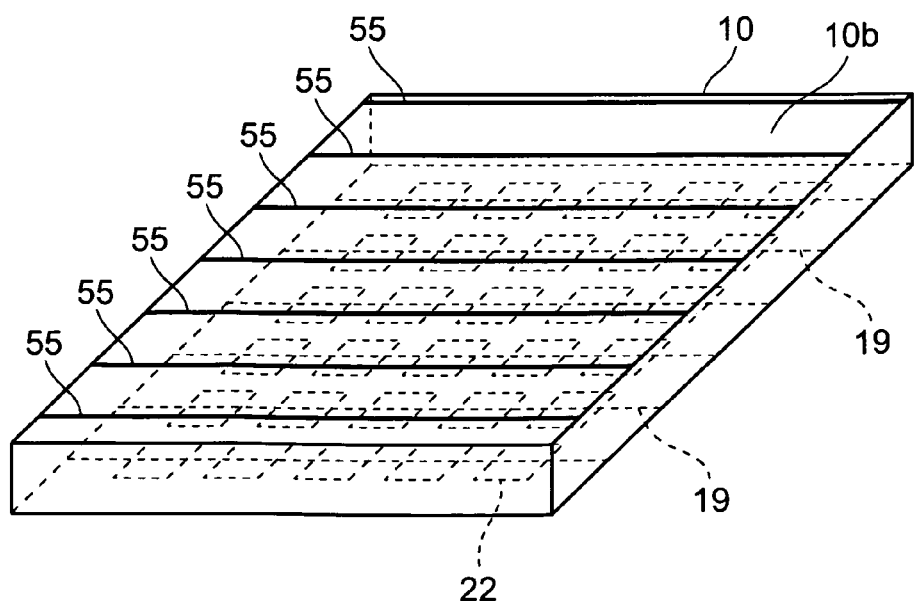
FIG. 19 is a perspective view illustrating the semiconductor laser chip manufacturing method according to the first embodiment of the present invention.
Figure 20:
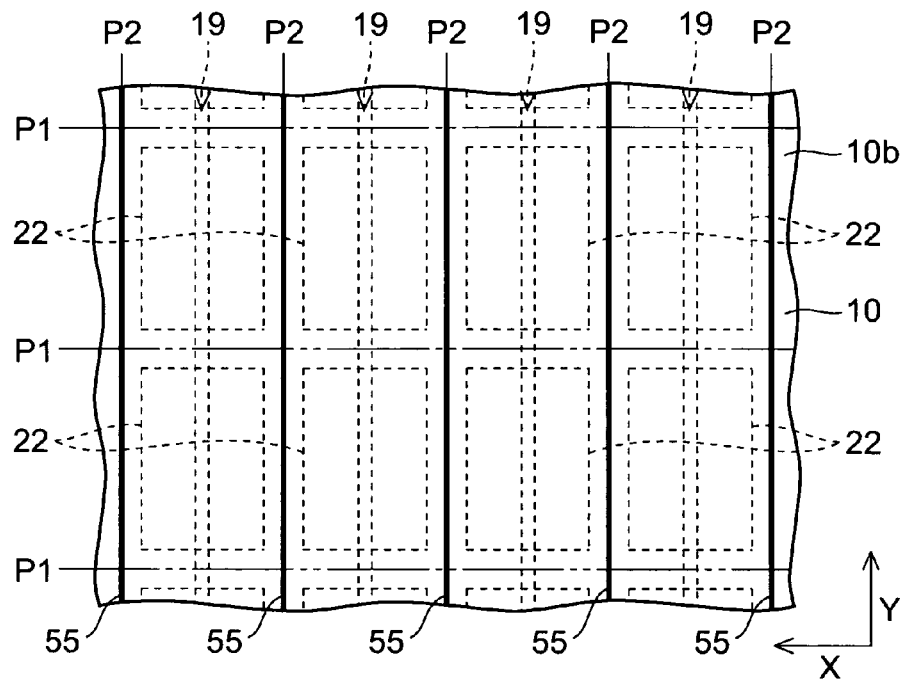
FIG. 20 is a plan view illustrating the semiconductor laser chip manufacturing method according to the first embodiment of the present invention (a view of a semiconductor wafer viewed from its rear side).
Figure 21:
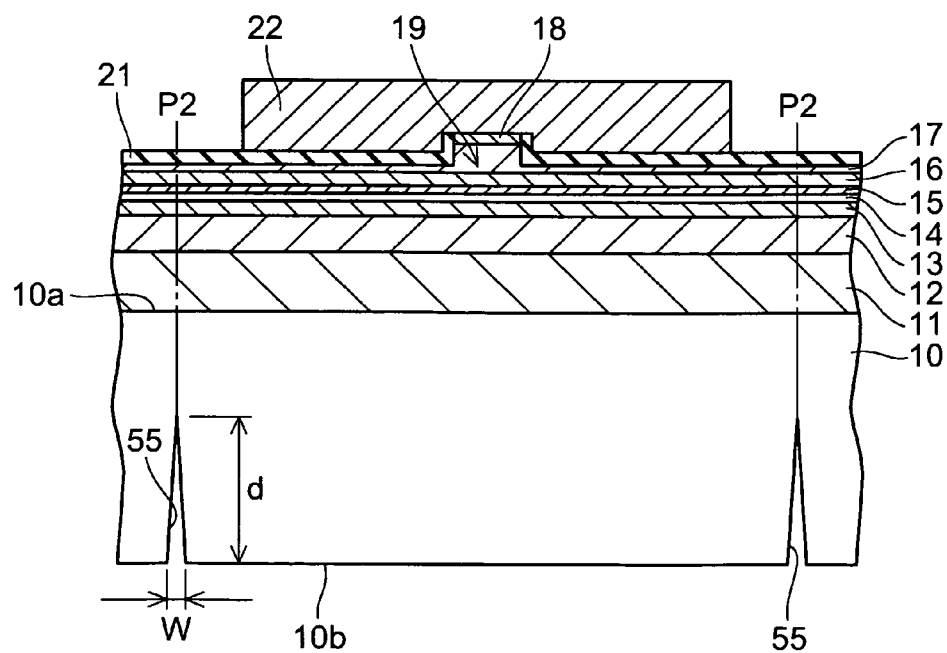
FIG. 21 is a sectional view illustrating the semiconductor laser chip manufacturing method according to the first embodiment of the present invention.

As illustrated in FIGS. 19 to 21, laser scribing is performed next on the rear surface 10b of the substrate 10 to form groove portions 55, which run linearly in a direction parallel to the ridge portions 19. The groove portions 55 are located to coincide with intended parting lines P2, which are each set between two adjacent ridge portions 19 (between one p-side electrode 22 and another p-side electrode 22 that are adjacent to each other in a direction X). Specifically, the groove portions 55 are formed between the stripe-patterned ridge portions 19 such that each groove portion 55 is equidistant from both of its adjacent ridge portions 19. The groove portions 55 double as parting grooves in a subsequent step of parting chips from one another as described later.

The reason why laser scribing is used to form the groove portions 55 is that, with laser scribing, the depth d (see FIG. 21) of the groove portion 55 can be adjusted freely and can be set satisfactorily deep. Specifically, the depth d of the groove portions 55 is made shallow by quickening the scribing speed and is made deep by slowing the scribing speed. In addition, the aspect ratio (w/d) of the groove portions 55 which is the ratio of an opening width w to the depth d of the groove portions 55 can be changed by adjusting the power of a processing laser that is used in forming the groove portions 55 by laser scribing.

The depth d of the groove portions 55 can be a desired depth within a range from 10% to 50% of the element thickness T (see FIG. 5). The depth d is also set to 10% to 50% of the chip width in order to give the groove portions 55 a heat dissipating function. For example, the groove depth set to 10% of the chip width corresponds to a 20% increase in the area of thermal contact with the solder 170 (see FIG. 8). Setting the depth d of the groove portions 55 deep renders the semiconductor wafer (substrate 10) vulnerable to accidental cracking, but the semiconductor wafer (substrate 10) can be made resistant against accidental cracking despite the deep depth d of the groove portions 55 by changing the aspect ratio of the groove portions 55.

In order to facilitate the forming of the metal layer 24 (see FIG. 4) on side faces of the groove portions 55 in a subsequent step, it is preferred to form the groove portions 55 such that the side faces of the groove portions 55 are slopes slanted at several degrees with respect to a normal line direction of the substrate 10 (semiconductor laser chip 100). After the groove portions 55 are formed by laser scribing, the substrate 10 may be washed with an acid or an alkali for the purpose of removing a substance that has been melted by the laser.

Figure 22:
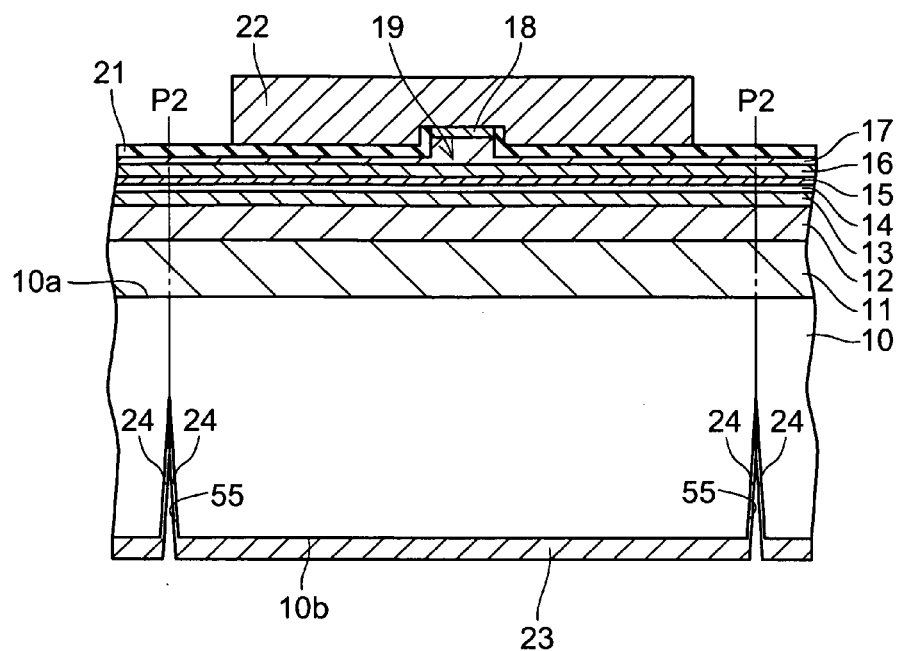
FIG. 22 is a sectional view illustrating the semiconductor laser chip manufacturing method according to the first embodiment of the present invention.

Next, as illustrated in FIG. 22, Hf/Al/Mo/Pt/Au films, or Ti/Pt/Au films, are formed in the stated order on the rear surface 10b of the substrate 10, to thereby form the n-side electrode (metal-made layer) 23 on the rear surface 10b of the substrate 10. In forming the n-side electrode 23, the metal layer 24 connected to the n-side electrode 23 is formed on the side faces of the groove portions 55 by allowing the electrode metal to run over to the side faces of the groove portions 55. Vacuum evaporation may be used to form the n-side electrode 23. However, with sputtering, there is more electrode metal running and the metal layer 24 is formed accordingly more efficiently on surfaces that are not positioned right across from a target, such as the side faces of the groove portions 55.

Before the n-side electrode 23 is formed, dry etching or wet etching may be performed for the purpose of adjusting the electrical properties of the n side.

Figure 23:
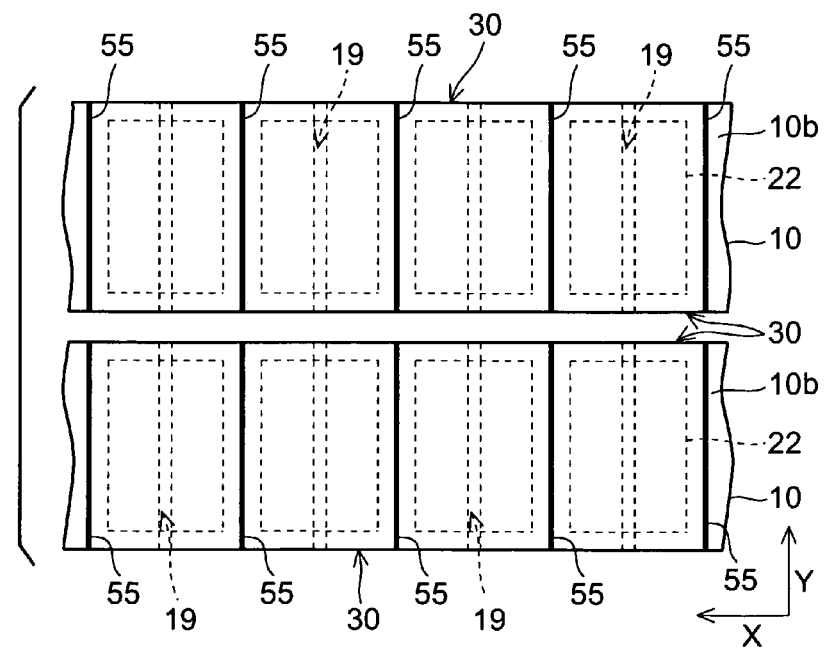
FIG. 23 is a plan view illustrating the semiconductor laser chip manufacturing method according to the first embodiment of the present invention (a view of the semiconductor wafer cut into bar-shaped pieces which is viewed from the rear side of a substrate).

Subsequently, as illustrated in FIG. 23, the semiconductor wafer (substrate 10) is cut into bar-shaped pieces by cleaving. Specifically, the semiconductor wafer (substrate 10) is cut into bar-shaped pieces by cleaving the wafer at intended parting lines P1 (see FIG. 20), which are each set between one p-side electrode 22 and another p-side electrode 22 that are adjacent to each other in a direction Y. In this manner, bars of elements are created and cleaved end faces of the bars of elements constitute mirror faces (for forming the mirror facets 30).

Thereafter, optical coating films (not shown) are formed on both end faces of each bar of elements created by cleaving, to thereby complete the mirror facets 30.

Lastly, the bars of elements are cut along the intended parting lines P2 (see FIG. 20) to part adjoined elements from one another and obtain individual chips. Specifically, a blade of a breaker (not shown) is pressed against the front surface 10a of the substrate 10 (the surface of the substrate 10 that is opposite from the surface where the groove portions 55 are formed), thereby applying stress to elements and parting adjoined elements in a bar of elements from one another with the groove portions 55 as starting points. The side faces 40 (see FIG. 4) stretching along the ridge portion 19 are formed as a result. In the thus formed side faces 40, the notched portions 5 (see FIG. 4) are formed because of the groove portions 55, where elements are parted from one another. The parting of chips turns the side faces of the groove portions 55 into the notched surfaces 5a of the notched portions 5, with the metal layer 24 formed on the notched surfaces 5a. The semiconductor laser chip 100 according to the first embodiment is manufactured in this manner.

As described above, the semiconductor laser chip manufacturing method according to the first embodiment uses laser scribing to form the groove portions 55, and therefore allows the depth .d of the groove portions 55 to be adjusted freely and to be set satisfactorily deep. This facilitates the parting of the semiconductor wafer (substrate 10) along the groove portions 55. The yield in breaking a wafer into chips is thus prevented from dropping.

In the first embodiment, where the n-side electrode 23 is formed on the rear surface 10b of the substrate 10 including at least a part of the side faces of the groove portions 55, the metal layer 24 is formed on the side faces of the groove portions 55. Therefore, the semiconductor laser chip 100 more improved in heat dissipation performance can easily be manufactured.

In the first embodiment, where the metal layer 24 connected to the n-side electrode 23 is formed on the side faces of the groove portions 55 by allowing an electrode metal to run over to the side faces of the groove portions 55, the metal layer 24 and the n-side electrode 23 are formed by the same process. This reduces man-hour for the manufacture of the semiconductor laser chip, which means less manufacture cost.

With the manufacturing method of the first embodiment structured as described above, it is easy to manufacture the highly reliable semiconductor laser chip 100 which has excellent characteristics.

If slopes constituting the side faces of the groove portions 55 in the first embodiment are slanted at an angle of 7° or less with respect to the normal line direction of the substrate 10, the semiconductor wafer can be parted along the groove portions 55 even more easily. The yield in breaking the semiconductor wafer into chips is thus easily prevented from dropping.

In the first embodiment, the semiconductor laser chip 100 enhanced in heat dissipation performance can be manufactured with an even higher yield by setting the depth d of the groove portions 55 to 10% or more and less than 50% of the element thickness T. Improving the yield lowers the cost.

Another possible way to shorten the distance from a ridge portion (optical waveguide) of a semiconductor laser chip mounted junction up to solder or a submount is to reduce the thickness of (a substrate of) the semiconductor laser chip. However, a semiconductor wafer to which this method is applied is less easy to handle. In the first embodiment, on the other hand, the heat dissipation performance of a semiconductor laser chip is improved satisfactorily without reducing the thickness of (a substrate of) the semiconductor laser chip, and the ease of handling of a semiconductor wafer is not lessened. The risk of accidentally cracking a semiconductor wafer is thus lowered, which is another feature of the first embodiment that improves the yield.

A method of mounting the semiconductor laser chip 100 is described next with reference to FIGS. 7 to 11.

First, the semiconductor laser chip 100 is fixed junction up onto the submount 130 as illustrated in FIGS. 8 and 9. To give a concrete example, the semiconductor laser chip 100 is put and heated on the submount 130 to which a sufficient amount of solder 170 (for example, AuZn solder) has been applied. When the amount of the solder 170 applied is sufficient and the length of heating time is adequate, the solder 170 reacts with the metal layer 24, which is provided on the notched portions 5, by expanding and rising, with the result that the semiconductor laser chip 100 is embedded in the solder 170.

The submount 130 may have the trench 131 suited to the width (in plan view) of the semiconductor laser chip 100 as illustrated in FIGS. 10 and 11. The semiconductor laser chip 100 in this case is bonded to the submount 130 while embedded in the trench 131.

The amount of the solder 170 to be applied is set such that the solder 170 rising as a result of the reaction reaches the metal layer 24 formed on the side faces 40 of the semiconductor laser chip 100. Specifically, when a solder pattern larger in plane area than the semiconductor laser chip 100 is formed, the thickness of the solder pattern is set to, for example, 2 μm to 3 μm. The adequate heating time is the time necessary to embed the semiconductor laser chip 100 in the solder 170.

Next, as illustrated in FIG. 7, the submount 130 to which the semiconductor laser chip 100 has been fixed is fixed onto the stem 110 (block portion 120) with, for example, SnAgCu solder. The same solder as the solder 170 with which the semiconductor laser chip 100 is fixed (for example, AuZn solder) may be used to fix the submount 130 to the stem 110 (block portion 120), so that the bonding of the semiconductor laser chip 100 to the submount 130 and the fixing of the submount 130 to the stem 110 are conducted simultaneously.

Thereafter, the semiconductor laser chip 100 is electrically connected to the lead pins 150 via the wires 160 by wire bonding.

Lastly, the cap 140 is welded to the stem 110. The semiconductor laser device according to the first embodiment is assembled in this manner.

In the thus structured semiconductor laser device of the first embodiment, where the semiconductor laser chip 100 is mounted junction up, the operating voltage is lowered and positioning difficulties in mounting the semiconductor laser chip 100 junction down are avoided. In addition, with the semiconductor laser chip 100 of the first embodiment mounted, the semiconductor laser device is improved in heat dissipation performance and has a prolonged life span.

An experiment conducted to check the ease of parting adjoined elements in a bar of elements into semiconductor laser chips is described next. In this experiment, the influence of the aspect ratio (w/d) of a groove portion over the breakableness of a bar of elements (bar) was checked by breaking bars of varying groove portion aspect ratios into elements and measuring the breakableness of the bars. The depth (d) of the groove portion was set to 23% of the element thickness (wafer thickness). The aspect ratio was varied by changing the opening width (w) of the groove portion.

Figure 24:
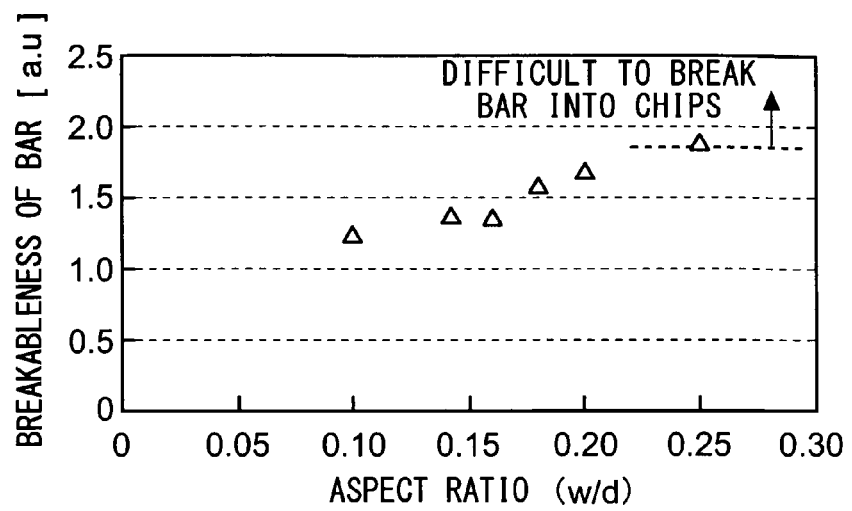
FIG. 24 is a graph in which differences in the ease of parting are plotted in relation to the aspect ratio when the depth of a groove portion is set to 23% of the wafer thickness.

FIG. 24 is a graph in which differences in the ease of parting are plotted in relation to the aspect ratio when the groove portion has a depth that is 23% of the wafer thickness.. In FIG. 24, the axis of ordinate shows the breakableness of a bar and the axis of abscissa shows the aspect ratio of the groove portion. The breakableness of a bar is defined as a load required to part adjoined elements in the bar from one another by pressing a blade of a breaker against the bar. However, because the breakableness of a bar depends on the length of the bar as well, a load required to break a bar that has a specific aspect ratio into elements at predetermined points is set as 1 (reference value), and the graph shows a load necessary for each breaking in relative value with respect to the reference value.

FIG. 24 shows that the breakableness of a bar (the axis of ordinate) takes a larger value when the aspect ratio is higher. In other words, a bar becomes harder to break as the aspect ratio of the groove portion increases. With the depth of the groove portion kept constant, a higher aspect ratio means a wider groove portion opening. A load applied to a bar is therefore dispersed from the tip of the groove portion when the aspect ratio increases, thereby making the bar hard to break.

A decrease in the breakableness of a bar lowers the yield, and it is confirmed that the yield in breaking a wafer into chips starts to decline at an aspect ratio of 0.25. In other words, it is confirmed that the yield drops below the acceptable level when the aspect ratio is larger than 0.25. While a bar hard to break is easier to handle, the yield drops when a bar is excessively hard to break. Considering these facts, a preferred aspect ratio of the groove portion is 0.25 or less.

Giving the groove portion an aspect ratio of 0.25 corresponds to slanting the side faces of the groove portion at approximately 7° with respect to the normal line direction of the semiconductor wafer (substrate 10). It is therefore confirmed that the side faces of the groove portion (notched surfaces of the notched portion) are preferred to be slopes slanted at an angle of 7° or less with respect to the normal line direction of the semiconductor wafer (substrate 10).

Modification Example of the First Embodiment

Figure 25:
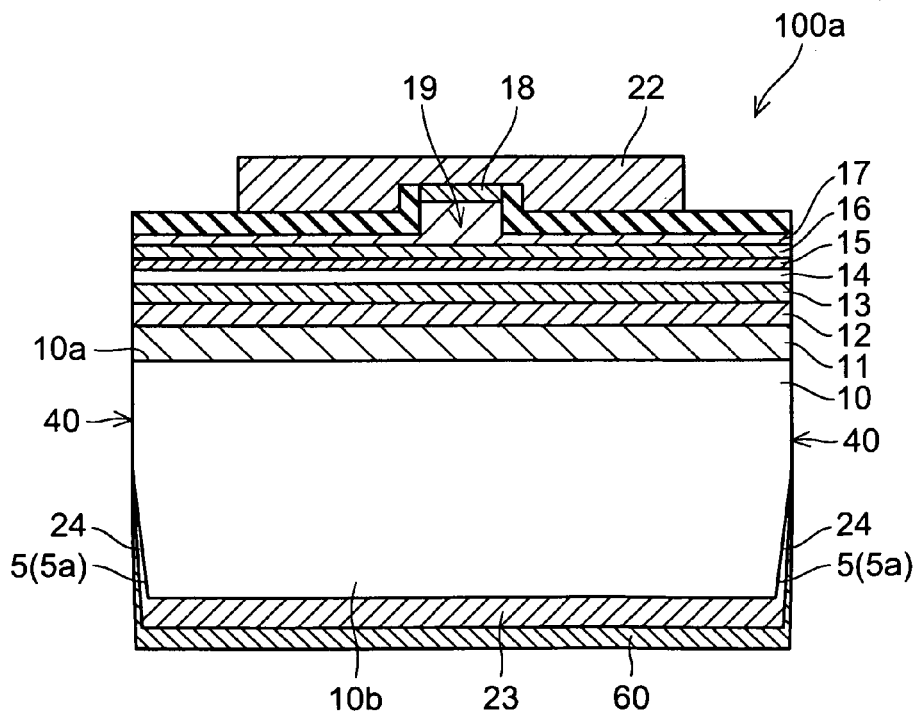
FIG. 25 is a sectional view of a semiconductor laser chip according to a modification example of the first embodiment.

FIG. 25 is a sectional view of a semiconductor laser chip according to a modification example of the first embodiment. A description is given next with reference to FIG. 25 on the structure of the semiconductor laser chip according to the modification example of the first embodiment which is denoted by 100a.

As illustrated in FIG. 25, the semiconductor laser chip 100a according to the modification example of the first embodiment is obtained by additionally forming a plating layer 60 on the n-side electrode 23 and the metal layer 24 in the structure of the first embodiment. The plating layer 60 is formed from gold, or from nickel/gold films, and covers the, metal layer 24 formed on the notched surfaces 5a.

In the modification example of the first embodiment, where the plating layer 60 is additionally formed on the metal layer 24 as described above, the wettability of solder with respect to the side faces 40 of the semiconductor laser chip 100a mounted junction up is prevented from dropping. The semiconductor laser chip 100a can therefore be easily embedded in solder up to the notched surfaces 5a of the notched portions 5.

Other effects of the modification example of the first embodiment are the same as those in the first embodiment.

The semiconductor laser chip 100a according to the modification example of the first embodiment is mounted junction up to be assembled into a semiconductor laser device as in the first embodiment.

Figure 26:
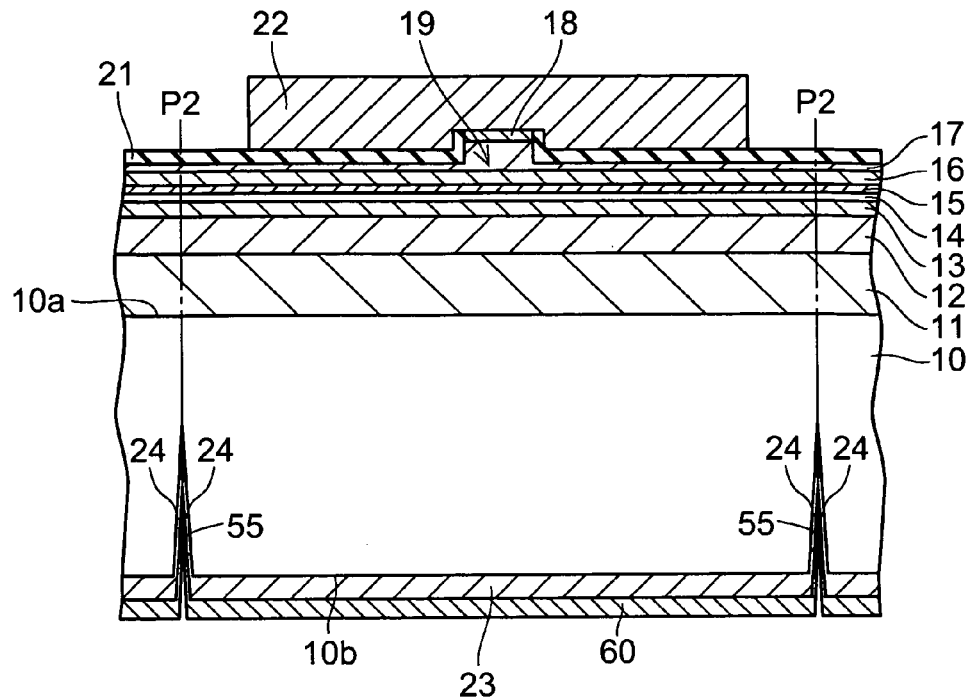
FIG. 26 is a sectional view illustrating a semiconductor laser chip manufacturing method according to the modification example of the first embodiment.

FIG. 26 is a sectional view illustrating a semiconductor laser chip manufacturing method according to the modification example of the first embodiment. A method of manufacturing the semiconductor laser chip 100a according to the modification example of the first embodiment is described next with reference to FIG. 26. Manufacturing steps of this modification example up through the forming of the n-side electrode 23 are the same as those in the first embodiment, and their descriptions are omitted.

In the modification example of the first embodiment, plating is used after the n-side electrode 23 is formed to additionally form the plating layer 60 on the n-side electrode 23 and on the metal layer 24 as illustrated in FIG. 26. The plating layer 60 having a uniform thickness is thus formed on these surfaces including the side faces of the groove portions 55.

Thereafter, the same method as in the first embodiment is used to break the semiconductor wafer (substrate) into bar-shaped pieces, and optical coating films (not shown) are formed on cleaved end faces of the bars of elements. Lastly, each bar of elements in which the optical coating films have been formed is broken into individual semiconductor laser chips. The semiconductor laser chip 100a according to the modification example of the first embodiment is manufactured in this manner.

Second Embodiment

Figure 27:
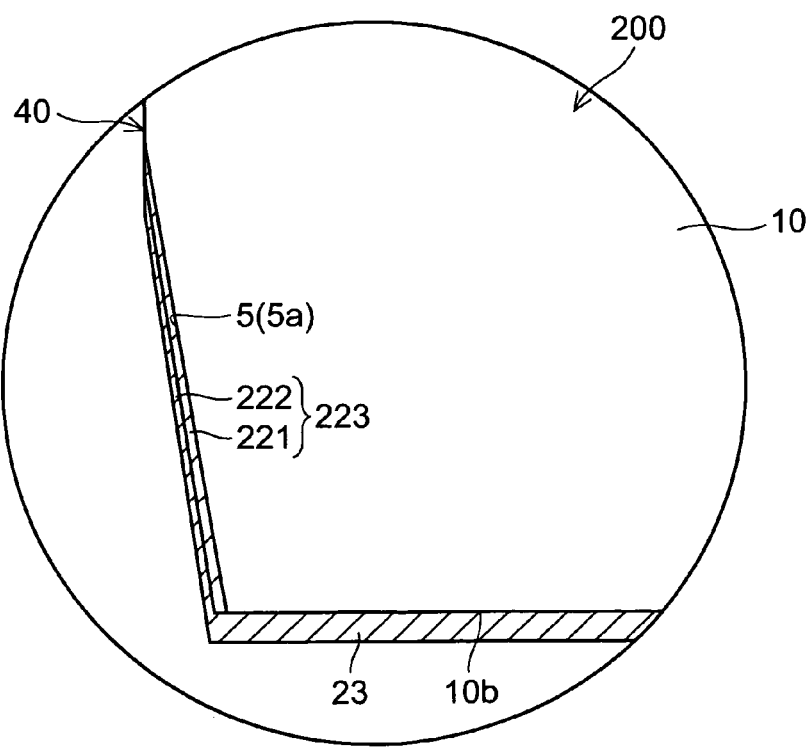
FIG. 27 is an enlarged sectional view of a part of a semiconductor laser chip according to a second embodiment of the present invention.

FIG. 27 is an enlarged sectional view of a semiconductor laser chip according to a second embodiment of the present invention. The description given next with reference to FIG. 27 is about the structure of the semiconductor laser chip according to the second embodiment of the present invention which is denoted by 200.

The semiconductor laser chip 200 according to the second embodiment differs from the first embodiment in that a metal layer 223 is formed on the notched surfaces 5a from a metal material different from that of the n-side electrode 23. Specifically, the metal layer 223 is formed by stacking metal layers 221 and 222 on the notched surfaces 5a of the notched portions 5. The metal layer 221 is formed separately from the n-side electrode 23, whereas the metal layer 222 is formed integrally with the n-side electrode 23. The metal layer 223 is an example of the "second metal layer" of the present invention. The metal layer 221 is made of, for example, tungsten, titanium, or gold, or a compound of these elements.

The rest of the structure of the semiconductor laser chip 200 according to the second embodiment is the same as in the first embodiment. The semiconductor laser chip 200 may include a plating layer additionally formed on the n-side electrode 23 and the metal layer 223 as in the modification example of the first embodiment.

In the second embodiment, where the metal layer 223 formed on the notched surfaces 5a of the notched portions 5 uses a metal material different from that of the n-side electrode 23 as described above, the metal layer 223 on the notched surfaces 5a can be set thick. This improves the wettability of solder, and the semiconductor laser chip 200 mounted junction up is therefore easily embedded in solder up to the notched surfaces 5a of the notched portions 5.

Other effects of the second embodiment are the same as those in the first embodiment.

The semiconductor laser chip 200 according to the second embodiment is mounted junction up to be assembled into a semiconductor laser device as in the first embodiment.

FIGS. 28 to 32 are views illustrating a semiconductor laser chip manufacturing method according to the second embodiment of the present invention. A method of manufacturing the semiconductor laser chip 200 according to the second embodiment of the present invention is described next with reference to FIGS. 27 to 32. Manufacture steps of the second embodiment up through the grinding or polishing of the rear surface 10b of the substrate 10 (semiconductor wafer) are the same as those in the first embodiment, and their descriptions are omitted.

Figure 28:
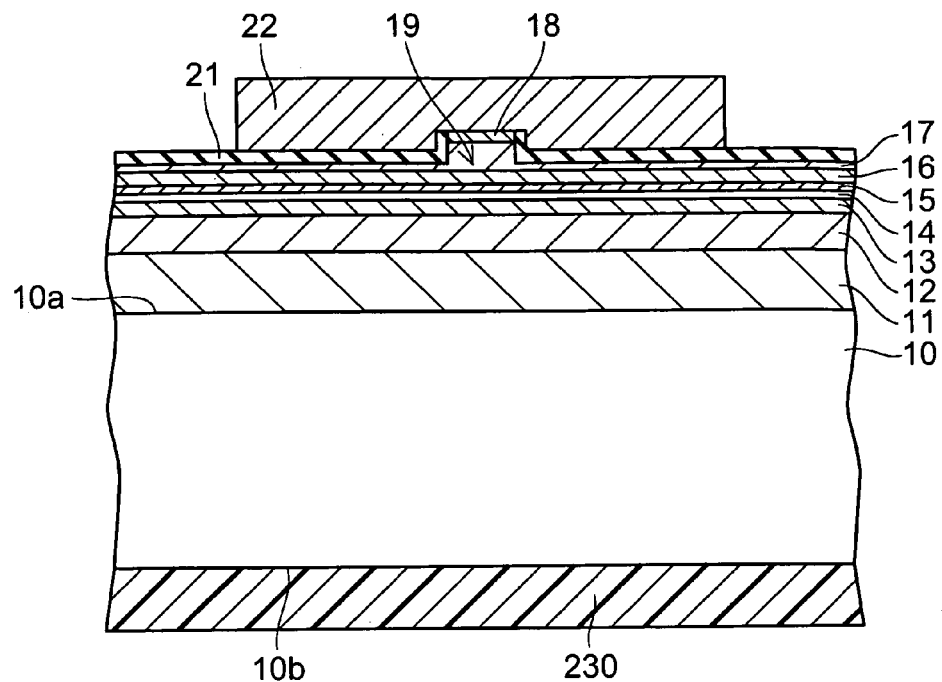
FIG. 28 is a sectional view illustrating a semiconductor laser chip manufacturing method according to the second embodiment of the present invention.
Figure 29:
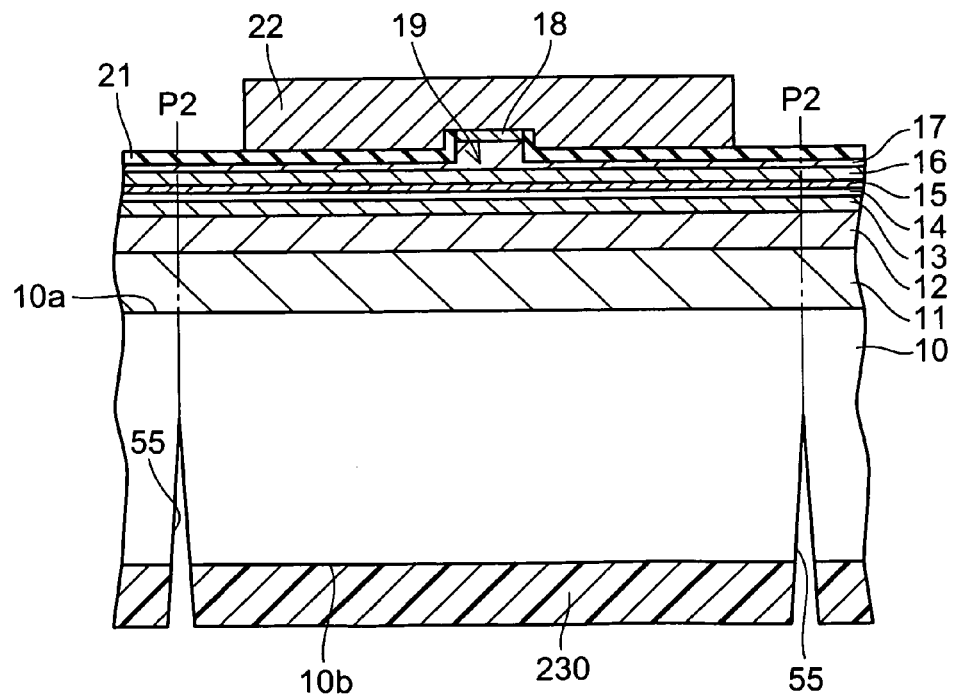
FIG. 29 is a sectional view illustrating the semiconductor laser chip manufacturing method according to the second embodiment of the present invention.

In the second embodiment, after the rear surface 10b of the substrate 10 (semiconductor wafer) is ground or polished, a resist layer 230 is formed on the entire rear surface 10b of the substrate 10 as illustrated in FIG. 28. Next, as illustrated in FIG. 29, laser scribing is performed on the rear surface 10b of the substrate 10 where the resist layer 230 has been formed, to thereby form the same groove portions 55 as those in the first embodiment.

Figure 30:
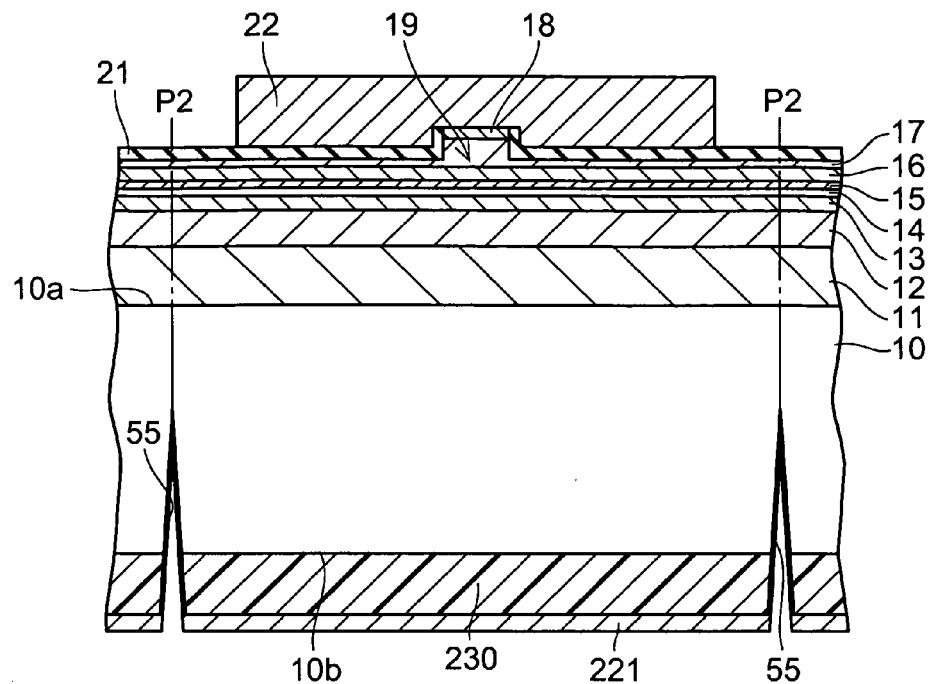
FIG. 30 is a sectional view illustrating the semiconductor laser chip manufacturing method according to the second embodiment of the present invention.
Figure 31:
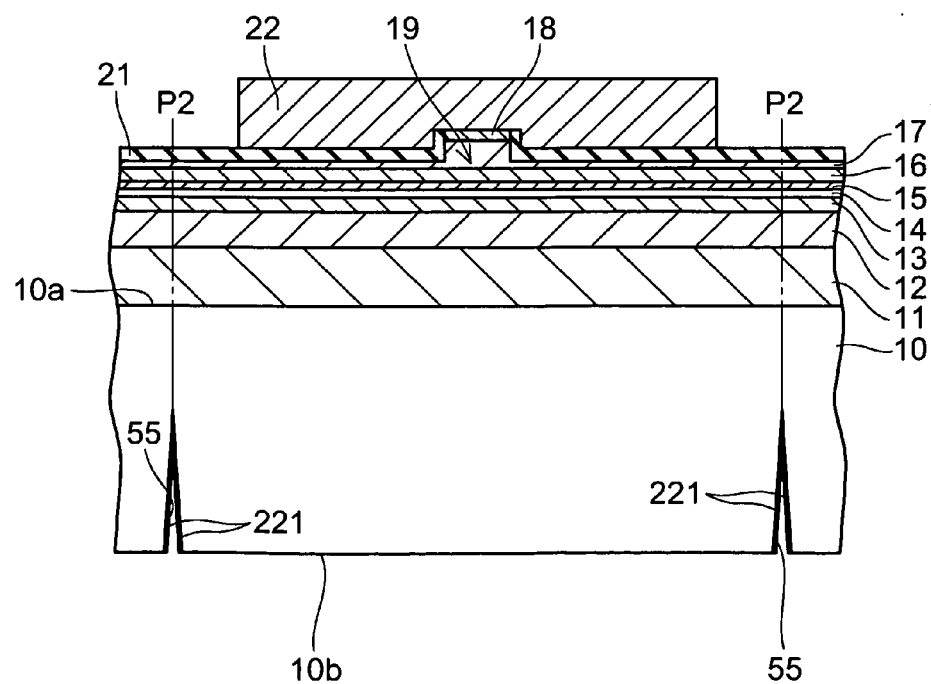
FIG. 31 is a sectional view illustrating the semiconductor laser chip manufacturing method according to the second embodiment of the present invention.

Subsequently, sputtering or the like is performed on the rear surface 10b of the substrate 10 to form the metal layer 221 on the entire surface as illustrated in FIG. 30. The resist layer 230 is then removed by lift-off This leaves the metal layer 221 only on the side faces of the groove portions 55 as illustrated in FIG. 31.

Instead of lift-off, photo etching or the like may be used to form the metal layer 221 inside the groove portions 55.

Figure 32:
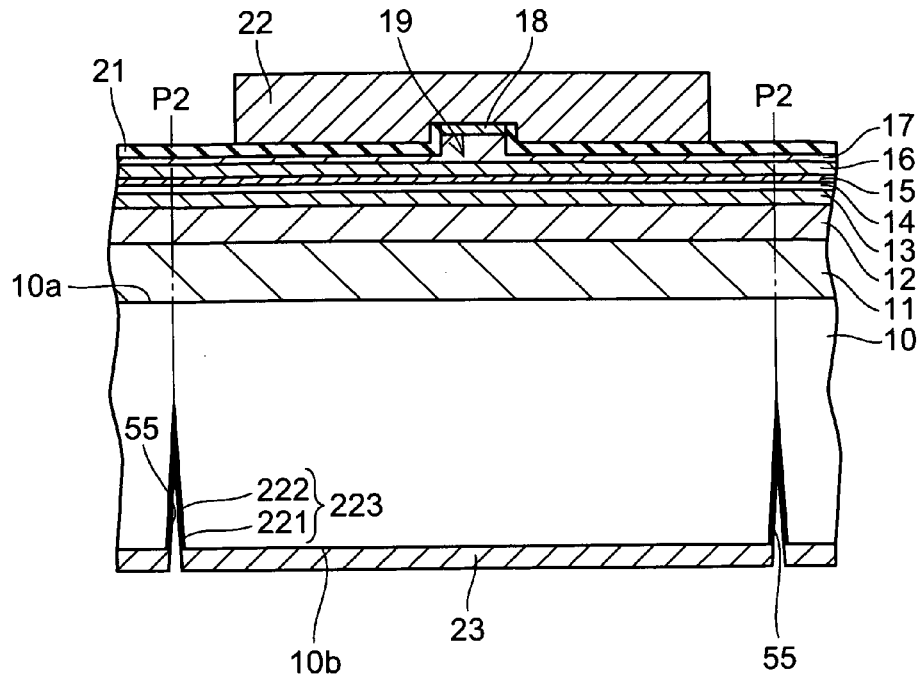
FIG. 32 is a sectional view illustrating the semiconductor laser chip manufacturing method according to the second embodiment of the present invention.

Next, as illustrated in FIG. 32, the same method as in the first embodiment is used to form the n-side electrode 23 on the rear surface 10b of the substrate 10. In forming the n-side electrode 23, the metal layer 222 (see FIG. 27) is formed integrally with the n-side electrode 23 above the side faces of the groove portions 55 (on the metal layer 221) by allowing an electrode metal to run over to the side faces of the groove portions 55. The metal layer 223 constituted of the metal layer 221 and the metal layer 222 and connected to the n-side electrode 23 is formed on the side faces of the groove portions 55 in this manner.

Thereafter, the same method as in the first embodiment is used to break the semiconductor wafer (substrate) into bar-shaped pieces, and optical coating films (not shown) are formed on cleaved end faces of the bars of elements. Lastly, adjoined elements in each bar of elements in which the optical coating films have been formed are parted from one another to obtain individual semiconductor laser chips 200. The semiconductor laser chip 200 according to the second embodiment is manufactured in this manner.

Third Embodiment

Figure 33:
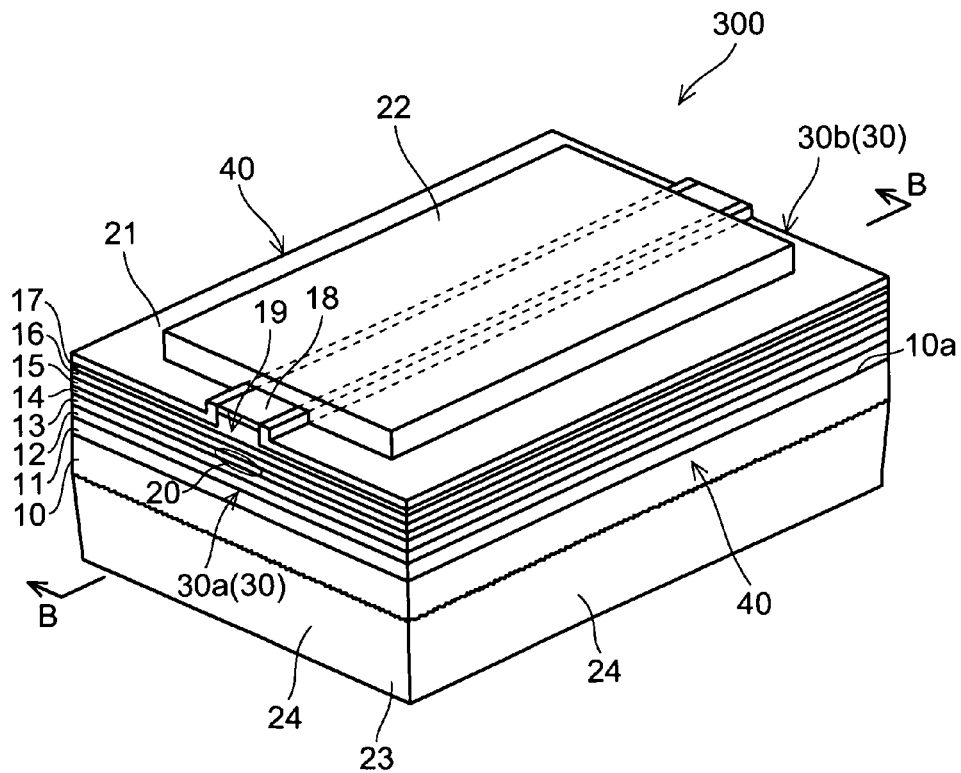
FIG. 33 is a perspective view of a semiconductor laser chip according to a third embodiment of the present invention.
Figure 34:
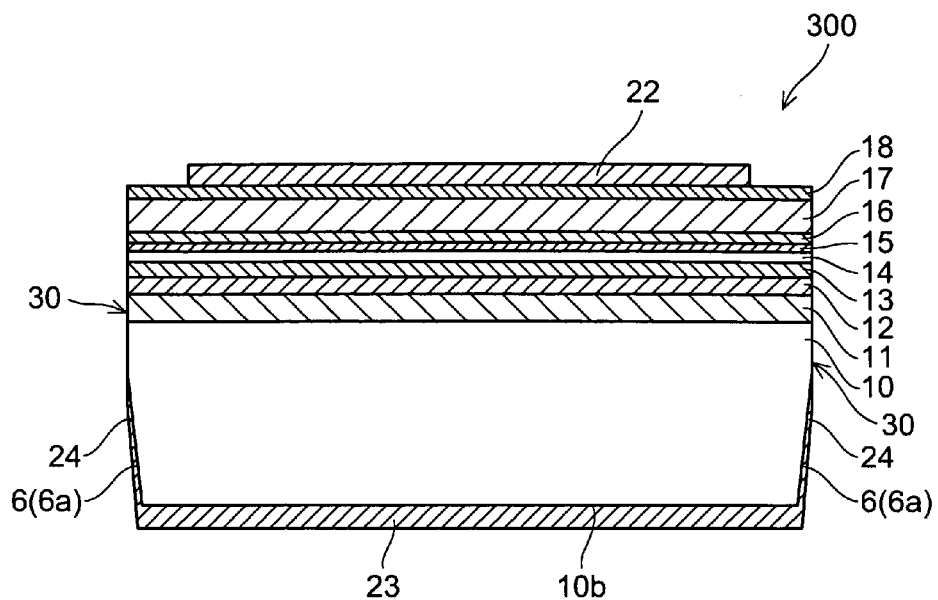
FIG. 34 is a sectional view taken along the line B-B of FIG. 33.

FIG. 33 is a perspective view of a semiconductor laser chip according to a third embodiment of the present invention. FIG. 34 is a sectional view taken along the line B-B of FIG. 33. Given next with reference to FIGS. 33 and 34 is a description on the structure of the semiconductor laser chip according to the third embodiment of the present invention which is denoted by 300.

As illustrated in FIGS. 33 and 34, the semiconductor laser chip 300 according to the third embodiment has notched portions 6 (see FIG. 34) formed in the mirror facets 30 which are the same as the notched portions 5 (see FIG. 4) formed in the side faces 40. The notched portions 6 formed in the mirror facets 30 have notched surfaces 6a on which the metal layer 24 connected to the n-side electrode 23 is formed. The metal layer, 24 is made of the same metal material as that of the n-side electrode 23, and is formed integrally with the n-side electrode 23. Specifically, the metal layer 24 is formed on the notched surfaces 6a of the notched portions 6 by stretching the n-side electrode 23 to the notched surfaces 6a of the notched portions 6. The n-side electrode 23 and the metal layer 24 are thus connected to each other without interruptions at the corners of the rear surface 10b of the substrate 10. The notched portions 6 formed in the mirror facets 30 are an example of "second notched portions" of the present invention, and the metal layer 24 formed on the notched surfaces 6a of the notched portions 6 is an example of the "first metal layer" of the present invention.

The rest of the structure of the semiconductor laser chip 300 according to the third embodiment is the same as in the first embodiment. The semiconductor laser chip 300 may include a plating layer additionally formed on the n-side electrode 23 and the metal layer 24 as in the modification example of the first embodiment.

In the third embodiment structured as above, the heat dissipation performance of the semiconductor laser chip 300 mounted junction up is easily improved.

The third embodiment, where the notched portions 6 are formed in the mirror facets 30, is also expected to have an effect in that solder is prevented from rising up along the mirror facets 30 to an undesirable level from the rear surface 10b of the substrate 10 and, affecting the laser power characteristics.

Other effects of the third embodiment are the same as those in the first embodiment.

The semiconductor laser chip 300 according to the third embodiment is mounted junction up to be assembled into a semiconductor laser device as in the first embodiment.

Figure 35:
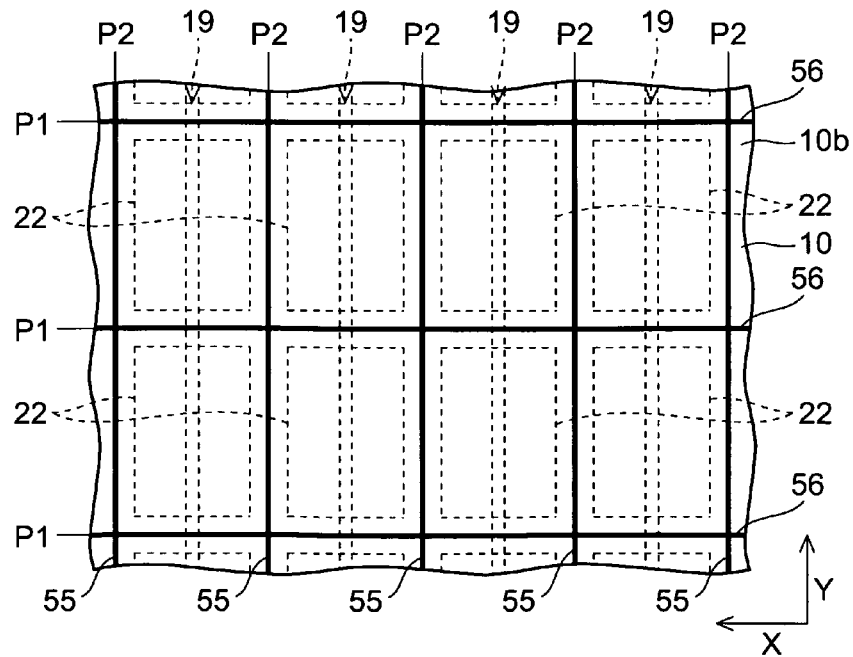
FIG. 35 is a plan view illustrating a semiconductor laser chip manufacturing method according to the third embodiment of the present invention (a view of a semiconductor wafer viewed from its rear side).

FIG. 35 is a view illustrating a semiconductor laser chip manufacturing method according to the third embodiment of the present invention. A method of manufacturing the semiconductor laser chip 300 according to the third embodiment of the present invention is described next with reference to FIGS. 20 and 23 and FIGS. 33 to 35. Manufacture steps of the third embodiment up through the forming of the groove portions 55 in the rear surface 10b of the substrate 10 (semiconductor wafer) are the same as those in the first embodiment, and their descriptions are omitted.

In the third embodiment after the rear surface 10b of the substrate 10 (semiconductor wafer) is ground or polished, laser scribing is performed on the rear surface 10b of the substrate 10 to form the groove portions 55 which run linearly in a direction parallel to the ridge portion 19 as illustrated in FIG. 35. The groove portions 55 are located to coincide with the intended parting lines P2, which are each set between two adjacent ridge portions 19 (between one p-side electrode 22 and another p-side electrode 22 that are adjacent to each other in the direction X). In the third embodiment, laser scribing is performed on the rear surface 10b of the substrate 10 to form cleaving assisting grooves 56, which are the same as the groove portions 55 and located to coincide with the intended parting lines P1. The cleaving assisting grooves 56 run linearly in a direction orthogonal to the ridge portions 19 (direction X).

Next, the same method as in the first embodiment is used to form the n-side electrode 23 on the rear surface 10b of the substrate 10. In forming the n-side electrode 23, the metal layer 24 (see. FIGS. 33 and 34) connected to the n-side electrode 23 is formed on the side faces of the groove portions 55 and on side faces of the cleaving assisting grooves 56 by allowing the electrode metal to run over to the side faces of the groove portions 55 and of the cleaving assisting grooves 56.

Next, as illustrated in FIG. 23, the semiconductor wafer (substrate) is broken into bar-shaped pieces by cleaving. Specifically, a blade of a breaker (not shown) is pressed against the front surface 10a of the substrate 10. (the surface of the substrate 10 that is opposite from the surface where the groove portions 55 are formed), thereby applying stress to elements and cleaving the semiconductor wafer along the intended parting line P1, with the cleaving assisting grooves 56 as starting points. In this manner, the semiconductor wafer (substrate) is broken into bar-shaped pieces, and cleaved end faces of the bars constitute mirror faces (for forming the mirror facets 30). By cleaving the semiconductor wafer with the cleaving assisting grooves 56 as starting points, the notched portions 6 (see FIG. 34) are formed in the resultant cleaved end faces for forming the mirror facets 30.

Thereafter, the optical coating films (not shown) are formed on the cleaved end faces (for forming the resonator faces 30) of the bars of elements. Lastly, adjoined elements in each bar of elements in which the optical coating films have been formed are parted from one another to obtain individual semiconductor laser chips 300. The semiconductor laser chip 300 according to the third embodiment is manufactured in this manner.

Fourth Embodiment

Figure 36:
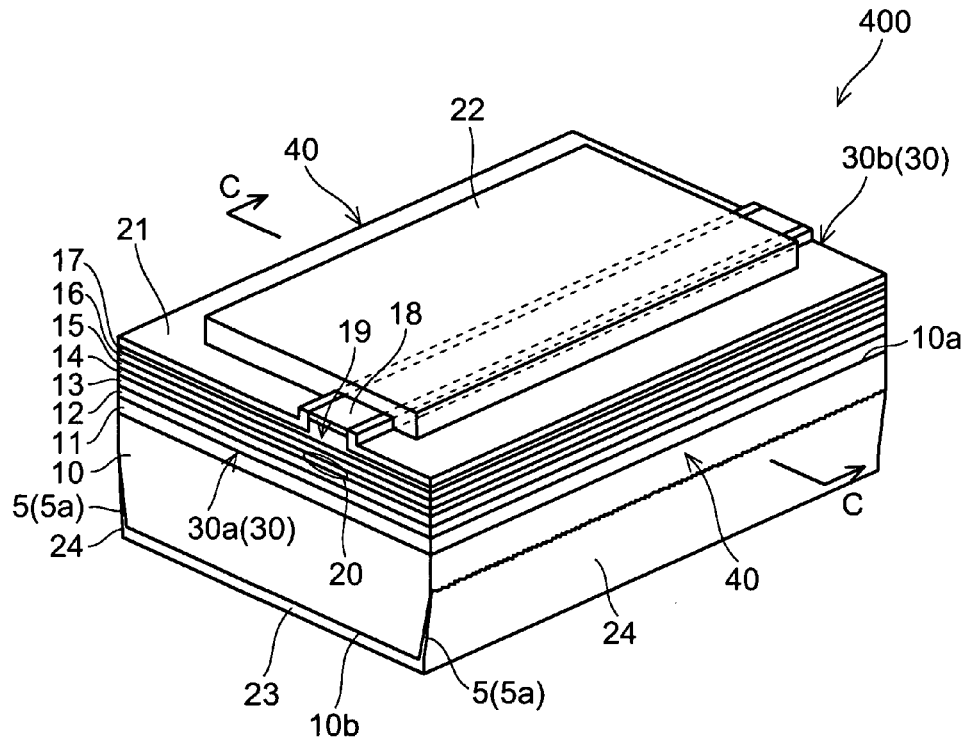
FIG. 36 is a perspective view of a semiconductor laser chip according to a fourth embodiment of the present invention.
Figure 37:
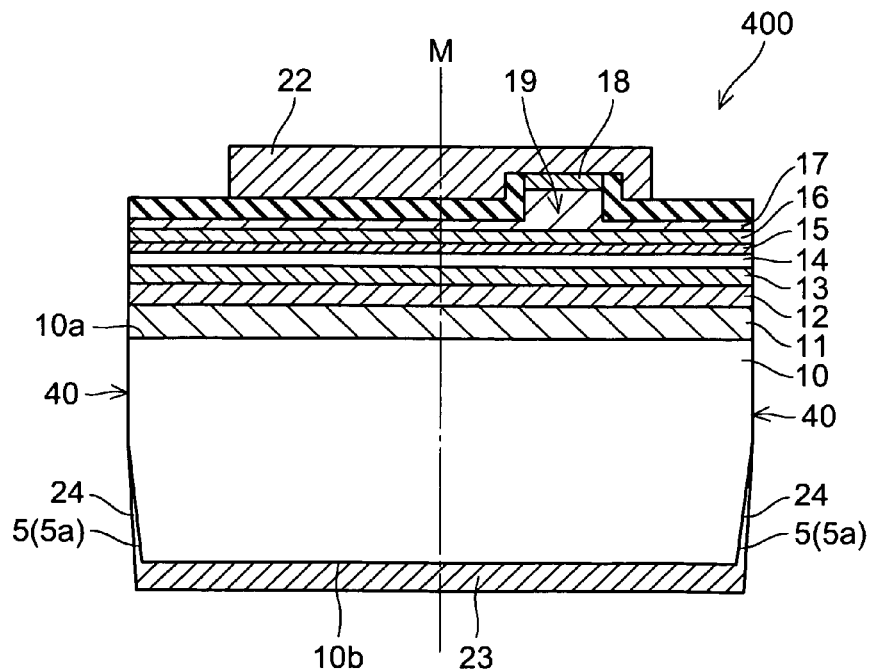
FIG. 37 is a sectional view taken along the line C-C of FIG. 36.

FIG. 36 is a perspective view of a semiconductor laser chip according to a fourth embodiment of the present invention. FIG. 37 is a sectional view taken along the line C-C of FIG. 36. Given next with reference to FIGS. 36 and 37 is a description on the structure of the semiconductor laser chip according to the fourth embodiment of the present invention which is denoted by 400.

In the semiconductor laser chip 400 according to the fourth embodiment, the ridge portion 19 (optical waveguide) is off a center M (see FIG. 37) of the semiconductor laser chip 400 (semiconductor layers) and closer to one of the side faces 40 as illustrated in FIGS. 36 and 37. This brings the ridge portion 19 (optical waveguide) closer to the metal layer 24 on the notched portions 5, which are formed in the side faces 40.

The rest of the structure of the semiconductor laser chip 400 according to the fourth embodiment is the same as in the first embodiment. The semiconductor laser chip 400 may include a plating layer additionally formed on the n-side electrode 23 and the metal layer 24 as in the modification example of the first embodiment.

In the fourth embodiment, where the ridge portion 19 (optical waveguide) is off the center M of the semiconductor laser chip 400 (semiconductor layers) and closer to one of the side faces 40 as described above, the distance from the ridge portion 19 (optical waveguide) to the notched portions 5 is cut short and heat generated in the optical waveguide is dissipated even more effectively.

Other effects of the fourth embodiment are the same as those in the first embodiment.

The semiconductor laser chip 400 according to the fourth embodiment is mounted junction up to be assembled into a semiconductor laser device as in the first embodiment.

The semiconductor laser chip 400 according to the fourth embodiment can be manufactured by forming a groove portion which runs in a direction parallel to the ridge portions 19 through laser scribing in the rear Surface 10b of the substrate 10 such that the groove portion is closer to one of two adjacent ridge portions 19. By forming the groove portion close to one of two adjacent ridge portions 19 through processing in this manner, the distance from each ridge portion 19 to the groove portion is shortened and heat is dissipated even more efficiently as described above.

Figure 38:
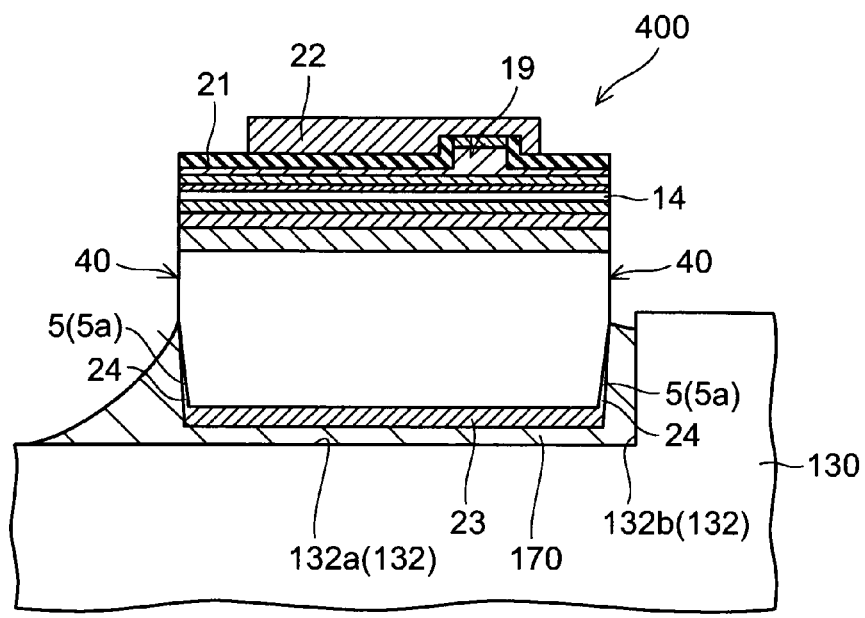
FIG. 38 is a sectional view illustrating another example of how the semiconductor laser chip is mounted to a semiconductor laser device according to the fourth embodiment of the present invention.
Figure 39:
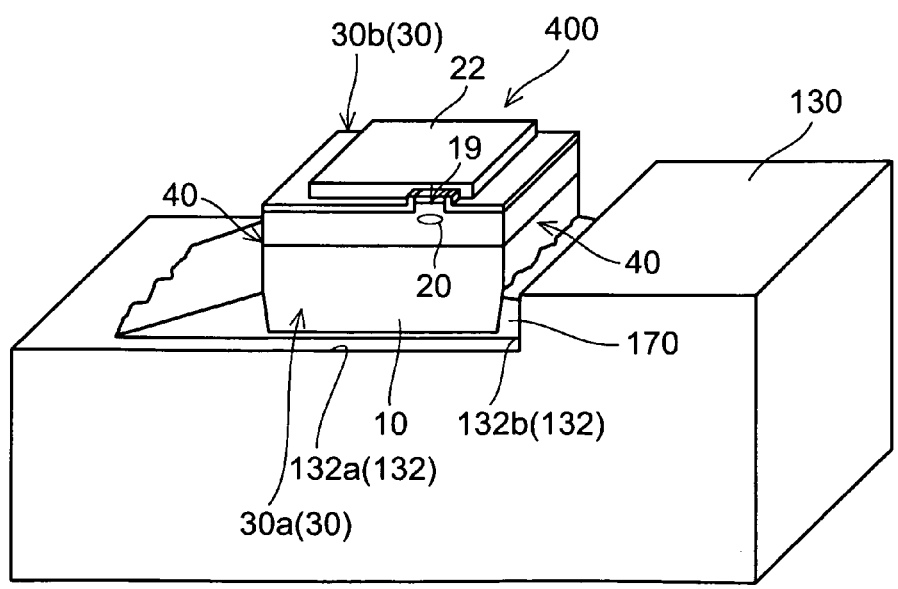
FIG. 39 is a perspective view illustrating the other example of how the semiconductor laser chip is mounted to the semiconductor laser device according to the fourth embodiment of the present invention.
Figure 40:
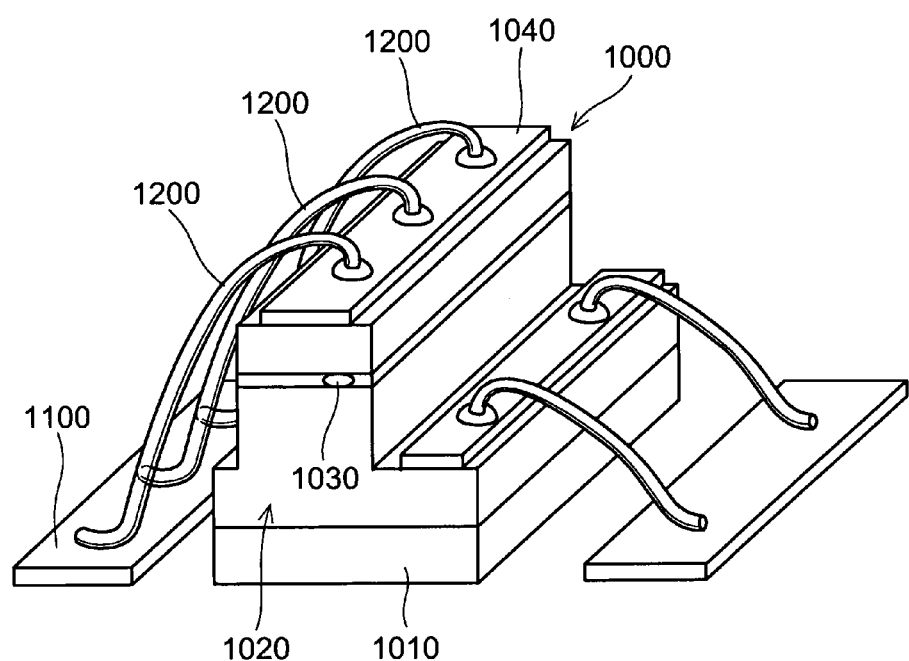
FIG. 40 is a perspective view of a conventional nitride semiconductor laser device that is described in JP 3618989 B.

FIGS. 38 and 39 are views illustrating another example of how the semiconductor laser chip is mounted to the semiconductor laser device according to the fourth embodiment of the present invention. The other example of how the semiconductor laser chip 400 is mounted is described next with reference to FIGS. 38 and 39.

In the other chip mount example of the fourth embodiment, a step (step portion) 132 is formed in the top surface of the submount 130 as illustrated in FIGS. 38 and 39. The step 132 has a bottom surface 132a and a side wall 132b. The semiconductor laser chip 400 is fixed onto the bottom surface 132a of the step 132 via the solder 170.

In the other chip mount example of the fourth embodiment, the semiconductor laser chip 400 is arranged such that its side surface 40 (side surface 40 closer to the ridge portion 19) surface the side wall 132b, and the solder 170 fills gaps between the side surface 40 (notched portion 5) and the side wall 132b. The metal layer 24 on the notched portions 24 is therefore in thermal contact with the submount 130 (side wall 132b) via the solder 170. With this structure, the semiconductor laser chip 400 is embedded in the solder 170 in a manner that brings the ridge portion 19 of the semiconductor laser chip 400 closer to the submount 130.

The embodiments disclosed herein are exemplifications in every aspect, and should not be construed as restrictive. The scope of the present invention is defined by terms set forth in the scope of claims, not by the description of the embodiments given above, and encompasses meanings equivalent to the scope of claims and all modifications within the scope of claims.

For instance, while the first to fourth embodiments describe examples of applying the present invention to a nitride-based semiconductor laser chip, the present invention is not limited thereto and is applicable to a semiconductor laser chip formed from other materials than a nitride-based material.

The first to fourth embodiments describe examples in which a GaN substrate is used, but the present invention is not limited thereto and a substrate made of InGaN, AlGaN, AlGaInN, or the like may be used. Alternatively, an insulating substrate such as a sapphire substrate may be employed. The thicknesses, compositions, and other properties of the nitride semiconductor layers formed by crystal growth on the substrate may be changed; or suitable properties may be combined, to obtain desired element characteristics. For example, a semiconductor layer may be added to or removed from the semiconductor layers, and the order of some of the semiconductor layers may be switched. The conductivity type of some of the semiconductor layers may be changed. In short, the semiconductor layers can be modified freely as long as the basic characteristics of a nitride semiconductor laser element are obtained. The semiconductor laser chips of the embodiments described above may also have a broad area element structure.

The first to fourth embodiments describe examples in which a notched portion with a metal layer is formed in each of the side faces of the semiconductor laser chip. However, the present invention is not limited thereto and a notched portion may be formed only in one of the side faces of the semiconductor laser chip.

The first to fourth embodiments describe examples in which notched portions are formed to span the entire length of the side faces of the semiconductor laser chip. However, the present invention is not limited thereto and notched portions running in a direction parallel to the ridge portion may be formed only in portions of the side faces of the semiconductor laser chip.

The first to fourth embodiments describe examples in which the notched portions (the groove portions, the cleaving assisting grooves) run linearly. However, the present invention is not limited thereto and intermittent notched portions (intermittent groove portions, intermittent cleaving assisting grooves) may be formed. For instance, the notched portions (the groove portions, the cleaving assisting grooves) may be dashed lines.

The first to fourth embodiments describe examples in which the groove portions (notched portions) are formed by laser scribing. However, the present invention is not limited thereto and other methods than laser scribing maybe used to form the groove portions (notched portions). Examples of the other methods than laser scribing include dicing.

In the first to fourth embodiments, the notched portions (groove portions, cleaving assisting grooves) may have a depth enough to reach the semiconductor layers.

The first to fourth embodiments describe examples in which a metal layer connected to the n-side electrode is formed on the notched surfaces of the notched portions. The connection between the metal layer and the n-side electrode may be partially broken at corners of the rear surface of the substrate. In short, the metal layer only needs to be connected to (in contact with) the n-side electrode at least partially. Even when the spatial connection between the metal layer and the n-side electrode is broken in places, the semiconductor laser chip can be embedded in solder or the like up to the side faces (notched portions) of the semiconductor laser chip, depending on die bonding conditions. However, in order to accomplish a stable yield, the metal layer should be in contact with (connected to) the n-side electrode.

The first to fourth embodiments describe examples in which solder is used as an example of heat dissipating material. However, the present invention is not limited thereto and the semiconductor laser chip may be mounted with the use of other heat dissipating materials than solder. Examples of the other heat dissipating materials than solder include a thermally conductive adhesive such as silver paste.

The first to fourth embodiments describe examples in which the semiconductor laser chip is mounted to a submount. However, the present invention is not limited thereto and the semiconductor laser chip may be mounted on other bases than a submount. For example, the semiconductor laser chip may be mounted directly on a heat dissipation base such as a stem.

The first to fourth embodiments describe examples in which the semiconductor laser chip is mounted, to a can-packaged semiconductor laser device. However, the present invention is not limited thereto and the semiconductor laser chip may be mounted to other types of semiconductor laser device than the can package type.

The first to fourth embodiments describe examples in which the semiconductor laser chip manufacturing method uses $SiO_2$ as a material for forming the embedding, layer. However, the present invention is not limited thereto and the embedding layer may be formed from other insulating materials than $SiO_2$, such as SiN, $Al_2O_3$, or $ZrO_2$.

The first to fourth embodiments describe examples in which a resist layer is used as a mask layer in forming the ridge portion. However, the present invention is not limited thereto and a mask layer made of $SiO_2$ or the like may be used to form the ridge portion. In this case, a combination of photolithography and dissolution by a hydrofluoric acid solution, or other methods, can be used to expose the top (top surface) of the ridge portion.

The first to fourth embodiments describe examples of applying the present invention to a ridge type laser structure.

However, the present invention is not limited thereto and is also applicable to other laser structures than a ridge type, such as a buried heterostructure (BH) type and a ridge by selective re-growth (RiS) type.

The first to fourth embodiments describe examples in which MOCVD is used to form the nitride semiconductor layers through crystal growth. However, the present invention is not limited thereto and the nitride semiconductor layers may be formed through crystal growth by other methods than MOCVD. Examples of the other employable methods than MOCVD include hydride vapor phase epitaxy (HVPE) and molecular beam epitaxy (MBE).

In the first to fourth embodiments, the size, shape, and the like of the p-side electrode can be modified suitably.

In the first to third embodiments, the semiconductor laser chip may be mounted on a submount that has a step as the one shown in the other chip mount example of the fourth embodiment.

What is claimed is:

1. A semiconductor laser chip, comprising:
    a substrate that comprises one principal surface and another principal surface opposite from the one principal surface;
    semiconductor layers formed on the one principal surface of the substrate;
    an optical waveguide formed in the semiconductor layers;
    first notched portions formed in regions that include the substrate and running along the optical waveguide, wherein the first notched portions comprise notched surfaces;
    a metal layer formed on at least part of the notched surfaces; and
    another metal layer, other than the metal layer, formed on the another principal surface and also on the metal layer,
    wherein the notched surfaces are covered only by the metal layer and the another metal layer, and the another principal surface is covered only by the another metal layer.

2. A semiconductor laser chip according to claim 1, further comprising side faces, which stretch along the optical waveguide,
    wherein the first notched portions are formed in the side faces.

3. A semiconductor laser chip according to claim 2,
    wherein the substrate and the semiconductor layers comprise a pair of the side faces which are opposed from each other, and
    wherein one first notched portion is formed in each of the pair of the side faces.

4. A semiconductor laser chip according to claim 1, wherein the semiconductor layers comprise nitride semiconductor layers.

5. A semiconductor laser chip according to claim 1, wherein the notched surfaces of the first notched portions comprise slopes slanted with respect to a normal line direction of the substrate.

6. A semiconductor laser chip according to claim 1, wherein the notched surfaces of the first notched portions comprise slopes slanted at an angle of 7° or less with respect to a normal line direction of the substrate.

7. A semiconductor laser chip according to claim 1, wherein the first notched portions have a depth in a thickness direction of the substrate from the another principal surface of the substrate which is 10% or more and less than 50% of a combined thickness of the substrate and the semiconductor layers.

8. A semiconductor laser device, comprising the semiconductor laser chip according to claim 1 embedded in a heat dissipating material up to the notched surfaces of the first notched portions.

9. A semiconductor laser device according to claim 8, further comprising a heat dissipation base on which the semiconductor laser chip is mounted,
    wherein the semiconductor laser chip is fixed junction up on the heat dissipation base via the heat dissipating material.

10. A semiconductor laser device according to claim 9,
    wherein the heat dissipation base comprises a step portion which has a bottom surface and a side wall, and
    wherein at least the another metal layer formed on the metal layer is in thermal contact with the side wall via the heat dissipating material by the semiconductor laser chip fixed onto the bottom surface of the step portion.

11. A semiconductor laser device according to claim 9, wherein the heat dissipation base comprises a submount.

12. A semiconductor laser device according to claim 8, wherein the heat dissipating material comprises solder.

13. A method of manufacturing a semiconductor laser chip, comprising:
    growing nitride semiconductor layers on a front surface of a substrate;
    forming a current channel portion in the nitride semiconductor layers;
    forming groove portions in a rear surface of the substrate so as to run parallel to the current channel portion;
    forming a metal layer on at least part of a side surface of the groove portions;
    forming another metal layer, other than the metal layer, on the rear surface of the substrate; and
    parting the substrate along the groove portions,
    wherein the forming of the groove portions comprises forming the grooves by laser scribing, and the forming of another metal layer comprises forming the another metal layer on the metal layer, and
    wherein the side surface of the groove portions is covered only by the metal layer and the another metal layer, and the rear surface of the substrate other than the side surface of the groove portions is covered only by the another metal layer.

14. A method of manufacturing a semiconductor laser chip according to claim 13, wherein the forming a metal layer comprises forming the metal layer by sputtering.

15. A method of manufacturing a semiconductor laser chip according to claim 13, further comprising, after the forming of the another metal layer, forming a plating layer on the another metal layer.

* * * * *